United States Patent
Kuchanuri et al.

(10) Patent No.: US 10,147,684 B1
(45) Date of Patent: Dec. 4, 2018

(54) INTEGRATED CIRCUIT DEVICES

(71) Applicant: Samsung Electronics Co., Ltd., Suwon-si, Gyeonggi-do (KR)

(72) Inventors: Subhash Kuchanuri, Hwaseong-si (KR); Sidharth Rastogi, Hwaseong-si (KR); Ranjan Rajeev, Hwaseong-si (KR); Chul-hong Park, Seongnam-si (KR); Jae-seok Yang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/815,083

(22) Filed: Nov. 16, 2017

(30) Foreign Application Priority Data

May 24, 2017 (KR) ........................ 10-2017-0064389

(51) Int. Cl.
| | |
|---|---|
| H01L 23/48 | (2006.01) |
| H01L 23/544 | (2006.01) |
| H01L 23/485 | (2006.01) |
| H03K 19/173 | (2006.01) |
| G06F 17/50 | (2006.01) |

(52) U.S. Cl.
CPC ........ *H01L 23/544* (2013.01); *G06F 17/5081* (2013.01); *H01L 23/485* (2013.01); *H03K 19/173* (2013.01); *H01L 2223/5444* (2013.01); *H01L 2924/0002* (2013.01)

(58) Field of Classification Search
CPC ..... H01L 23/48; H01L 23/481; H01L 23/482; H01L 23/4825; H01L 23/485; G06F 17/50; G06F 17/5068; G06F 17/5081
See application file for complete search history.

(56) References Cited

U.S. PATENT DOCUMENTS

| | | | |
|---|---|---|---|
| 7,327,591 B2* | 2/2008 | Sadra | H01L 27/1104 257/E27.099 |
| 7,973,371 B2 | 7/2011 | Furuta et al. | |
| 8,294,212 B2 | 10/2012 | Wang et al. | |
| 8,661,392 B2* | 2/2014 | Quandt | H01L 27/0207 716/122 |
| 8,667,443 B2 | 3/2014 | Smayling et al. | |
| 8,984,465 B1 | 3/2015 | Salowe | |
| 9,269,702 B2 | 2/2016 | Quandt et al. | |
| 9,437,588 B1 | 9/2016 | Zeng et al. | |
| 2014/0115546 A1* | 4/2014 | Wang | G06F 17/5068 716/55 |
| 2016/0147927 A1* | 5/2016 | Chiang | G06F 17/5072 257/401 |
| 2016/0300840 A1* | 10/2016 | Seo | H01L 21/823871 |

(Continued)

FOREIGN PATENT DOCUMENTS

| | | |
|---|---|---|
| JP | 2009094201 A | 4/2009 |
| KR | 1020170015070 A | 2/2017 |

*Primary Examiner* — Jason Crawford
(74) *Attorney, Agent, or Firm* — Myers Bigel, P.A.

(57) ABSTRACT

An integrated circuit device includes: a pair of reference conductive lines arranged in parallel in a first direction in a first version logic cell and a pair of swap conductive lines arranged in parallel in a second version logic cell, wherein one reference conductive line and one swap conductive line in different wiring tracks of the pair of reference conductive lines and the pair of swap conductive lines have the same planar shape and the same length, and extend to intersect a cell boundary between the first version logic cell and the second version logic cell.

20 Claims, 20 Drawing Sheets

(56) References Cited

U.S. PATENT DOCUMENTS

2017/0032073 A1* 2/2017 Chen .................... G06F 17/5077
2017/0104004 A1* 4/2017 Quandt ............... H01L 27/0207
2017/0161424 A1* 6/2017 Tsai .................... G06F 17/5072

* cited by examiner

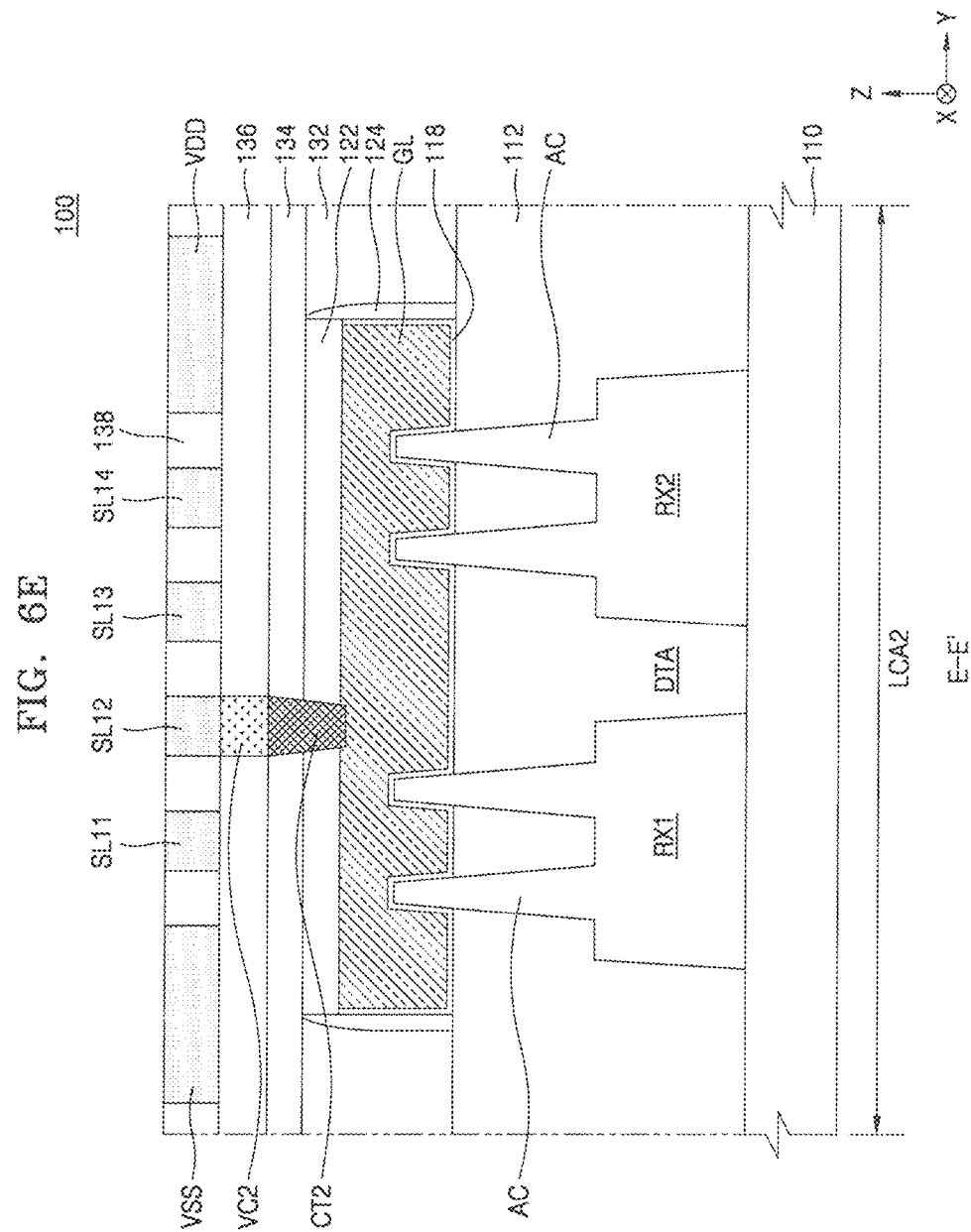

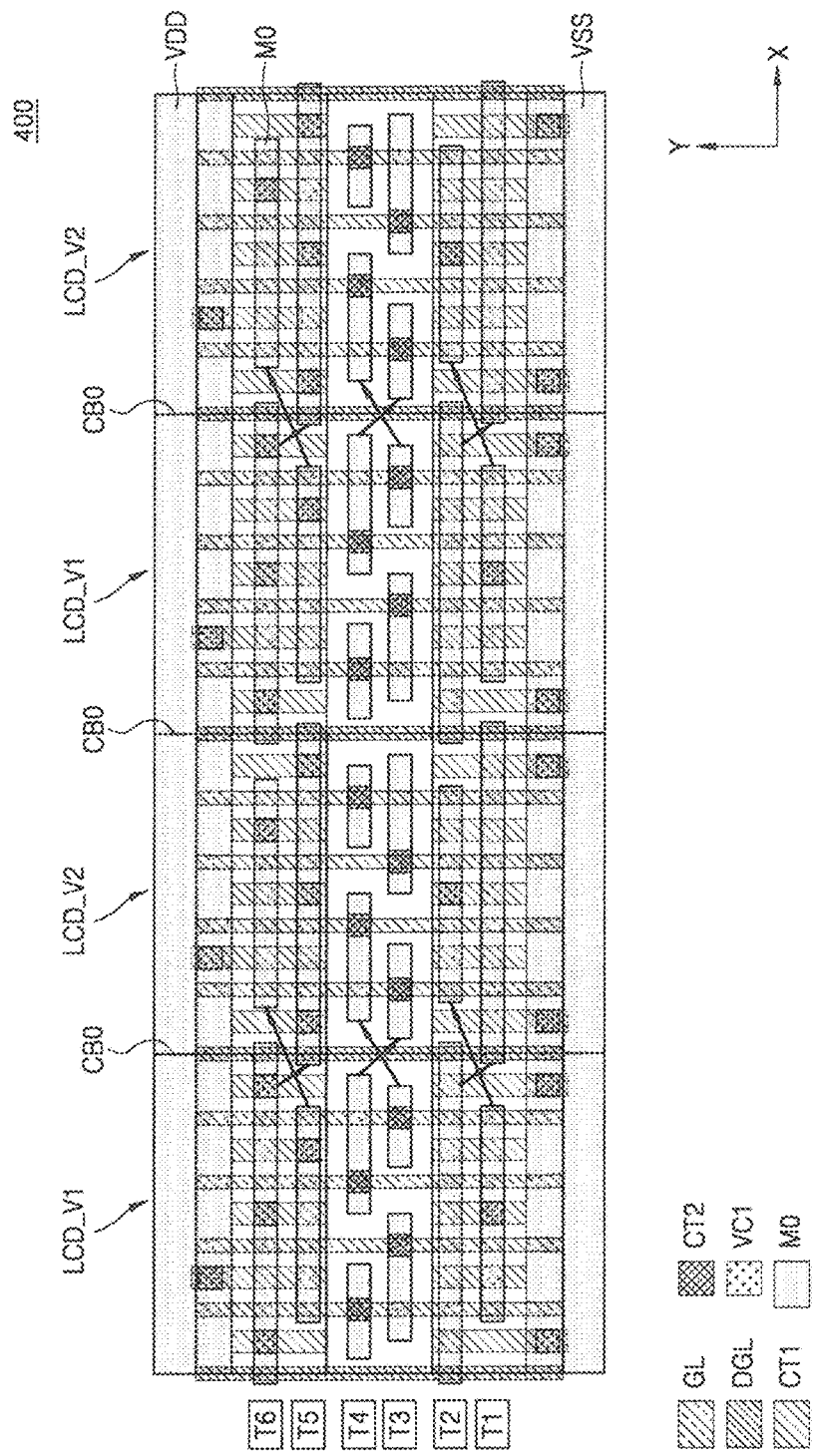

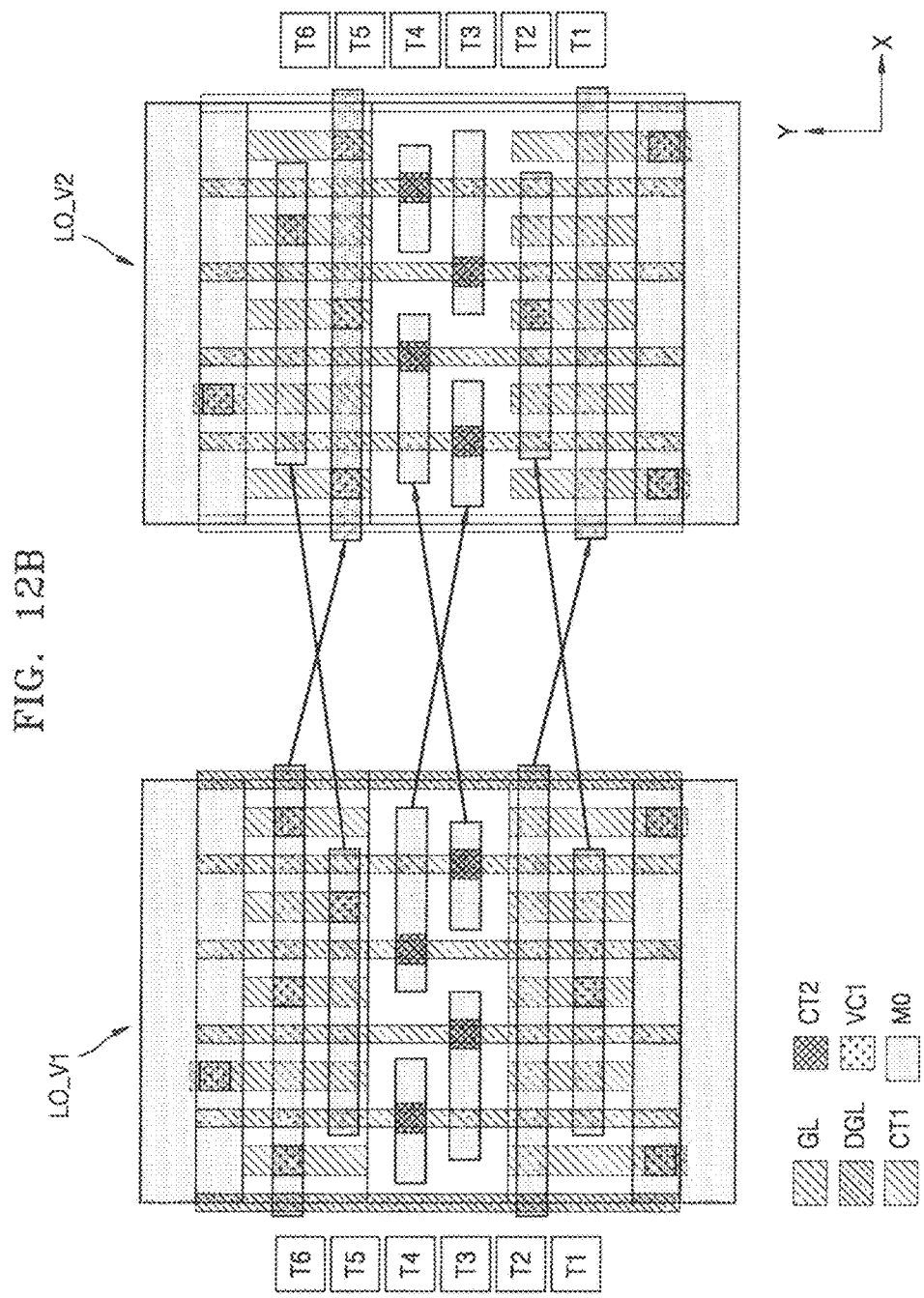

INTEGRATED CIRCUIT DEVICES

CROSS-REFERENCE TO RELATED APPLICATION

This U.S. non-provisional patent application claims priority under 35 U.S.C. § 119 to Korean Patent Application No. 10-2017-0064389, filed on May 24, 2017, in the Korean Intellectual Property Office, the entire contents of which are herein incorporated by reference.

BACKGROUND

The inventive concepts relate to integrated circuit devices, and more particularly, to integrated circuit devices including a plurality of conductive lines.

Due to the development of electronic technology, semiconductor devices have rapidly been down-scaled in recent years. Since a high operating speed, as well as operational accuracy, may be important in highly down-scaled integrated circuit devices, there is a need to provide a wiring structure that includes conductive lines having a stable layout structure within a relatively small area.

SUMMARY

The inventive concepts provide integrated circuit devices that are capable of securing a tip-to-tip margin between conductive lines of adjacent cells and a contact margin without applying a strict design rule to the integrated circuit devices having a device region with a reduced area due to down-scaling.

According to an aspect of the inventive concepts, there is provided an integrated circuit device including: a plurality of reference conductive lines extending in a first direction within a first logic cell region defined by a first cell boundary and extending along a plurality of wiring tracks arranged in parallel with each other; and a plurality of swap conductive lines extending along the plurality of wiring tracks in a second logic cell region defined by a second cell boundary, wherein at least one reference conductive line of the plurality of reference conductive lines includes a first tip portion extending from the first logic cell region into the second logic cell region across the first cell boundary, and wherein at least one swap conductive line of the plurality of swap conductive lines includes a first corresponding tip portion extending from the second logic cell region into the first logic cell region across the second cell boundary.

According to another aspect of the inventive concepts, there is provided an integrated circuit device including: a first logic cell region including a first reference conductive line and a second reference conductive line extending in parallel to each other in a first direction on a substrate; a second logic cell region including a first swap conductive line and a second swap conductive line extending in parallel to each other in the first direction on the substrate; and a cell boundary portion between the first logic cell region and the second logic cell region, wherein the first reference conductive line includes a first tip portion spaced from the cell boundary portion and facing the second logic cell region, wherein the second reference conductive line includes a second tip portion extending from the first logic cell region into the second logic cell region across the cell boundary portion, wherein the first swap conductive line includes a first corresponding tip portion extending collinear to the first reference conductive line and extending into the first logic cell region across the cell boundary portion to face the first tip portion, and wherein the second swap conductive line includes a second corresponding tip portion extending collinear to the second reference conductive line and spaced from the cell boundary portion to face the second tip portion.

According to another aspect of the inventive concepts, there is provided an integrated circuit device including: a first version logic cell including a plurality of first gate lines on a substrate and a first multilayer wiring structure on the plurality of first gate lines and configured to perform a first function; a second version logic cell adjacent the first version logic cell on the substrate, including a plurality of second gate lines and a second multilayer wiring structure on the plurality of second gate lines and configured to perform the first function; a pair of reference conductive lines arranged in parallel with each other in a first direction at a first level closest to the plurality of first gate lines in the first multilayer wiring structure; and a pair of swap conductive lines arranged in parallel with each other in the first direction at a same level as the first level in the second multilayer wiring structure, wherein one reference conductive line and one swap conductive line in different wiring tracks among the pair of reference conductive lines and the pair of swap conductive lines have a same planar shape and a same length, and wherein the one reference conductive line and the one swap conductive line extend so as to intersect a cell boundary between the first version logic cell and the second version logic cell, respectively.

BRIEF DESCRIPTION OF THE DRAWINGS

Embodiments of the inventive concepts will be more clearly understood from the following detailed description taken in conjunction with the accompanying drawings in which:

FIGS. 6A to 6E are cross-sectional views taken along line A-A', line B-B', line C-C', line D-D', and line E-E', respectively, in FIG. 5A;

FIGS. 9A and 9B are a planar layout diagrams showing a main configuration of an integrated circuit device according to other embodiments of the inventive concepts;

FIGS. 12A and 12B are plan views for describing a process of designing a layout according to process P510 of FIG. 10 in more detail.

DETAILED DESCRIPTION

Figure 1:
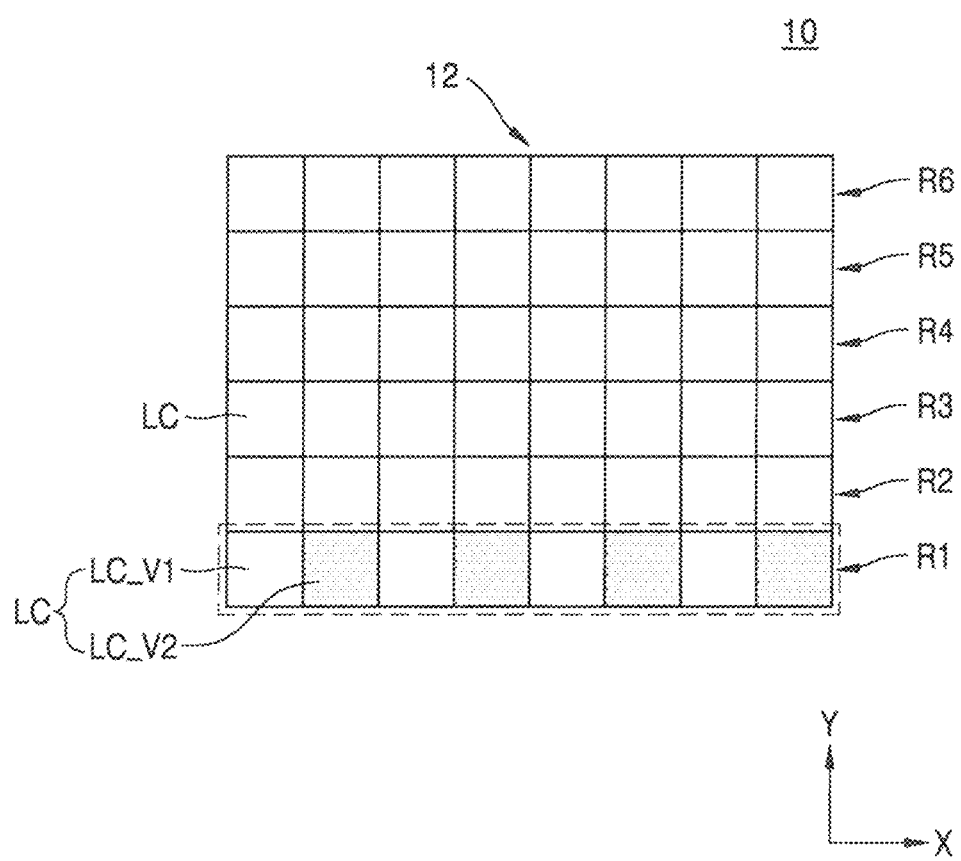
FIG. 1 is a plan view showing an example cell block of an integrated circuit device according to embodiments of the inventive concepts.

Hereinafter, embodiments of the inventive concepts will be described in detail with reference to the accompanying drawings. Like components will be denoted by like reference numerals throughout the specification, and repeated descriptions thereof will be omitted.

FIG. 1 is a plan view showing an example of a cell block 12 of an integrated circuit device 10 according to embodiments of the inventive concepts.

Referring to FIG. 1, the cell block 12 of the integrated circuit device 10 may include a plurality of logic cells LC including circuit patterns for configuring various circuits. The plurality of logic cells LC may be arranged in a matrix form in a width direction (e.g., X direction) and a height direction (e.g., Y direction).

The plurality of logic cells LC may each include a circuit pattern having a layout designed according to a place and route (PnR) technique to perform at least one logic function. The plurality of logic cells LC may perform various logic functions. In some embodiments, the plurality of logic cells LC may respectively include a plurality of standard cells. In some embodiments, at least some of the plurality of logic cells LC may perform the same logic function. In some embodiments, at least some of the plurality of logic cells LC may perform different logic functions.

The plurality of logic cells LC may include various kinds of logic cells including a plurality of circuit elements. For example, some of the plurality of logic cells LC may include an AND, NAND, OR, NOR, XOR (exclusive OR), XNOR (exclusive NOR), INV (inverter), ADD (adder), BUF (buffer), DLY (delay), FIL (filter), multiplexer (MXT/MXIT), OAI (OR/AND/INVERTER), AO (AND/OR), AOI (AND/OR/INVERTER), D flip-flop, reset flip-flop, master-slave flip-flop, latch, and/or a combination thereof, but the inventive concepts are not limited thereto.

In the cell block 12, at least some of the plurality of logic cells LC forming one row R1 along the width direction (e.g., X direction) may have the same width. Further, the plurality of logic cells LC forming the one row R1 may have the same height. However, the inventive concepts are not limited to the configurations illustrated in FIG. 1. At least some of the plurality of logic cells LC forming the one row R1 may have different widths and heights. Two logic cells LC adjacent to each other in the width direction in the plurality of logic cells LC forming the one row R1 may be in direct contact with each other (e.g., without a distance therebetween).

In the plurality of logic cells LC forming the one row R1, the two adjacent logic cells LC may include multiple versions of logic cells having the same or similar function but having different wiring structures. For example, the plurality of logic cells LC may include a first version logic cell LC_V1 and a second version logic cell LC_V2 adjacent to each other in the one row R1. The first version logic cell LC_V1 and the second version logic cell LC_V2 may perform the same or similar function but may have different wiring structures. In the first version logic cell LC_V1 and the second version logic cell LC_V2, conductive lines on the same level may have substantially the same arrangement and may have a conductive line arrangement structure that is mutually swapped to exchange wiring structures of the conductive lines along optionally selected two wiring tracks.

In some embodiments, the first version logic cell LC_V1 and the second version logic cell LC_V2 may each have a multilayer wiring structure. An nth level (n is an integer of 1 or more) wiring structure that is any level of the multilayer wiring structure of the first version logic cell LC_V1 may include a pair of reference wiring lines extending along adjacent first and second wiring tracks. In some embodiments, a level of a logic cell refers to a distance from a boundary of the logic cell in a particular direction (e.g., Y direction). In some embodiments, the level may indicate a height in a height direction (e.g., Y direction) from a base of the logic cell. In some embodiments, a wiring track is a location within a level of the logic cell in which conductive lines are placed. A wiring structure of the same level as the nth level in the multilayer wiring structure of the second version logic cell LC_V2 may include a pair of swapped conductive lines that extend at the same height as the first and second wiring tracks, have the same or similar function and/or shape as the pair of reference wiring lines, and exchange positions of the respective wiring tracks with each other.

The same version logic cells LC may not be disposed adjacent to each other in the width direction (e.g., X direction) in the one row R1 constituting the cell block 12. For example, in the one row R1, the first version logic cell LC_V1 and the second version logic cell LC_V2 may be alternately arranged one by one along the width direction (e.g., X direction). Thus, it is possible to have a structure in which the one second version logic cell LC_V2 is interposed between each of the plurality of first version logic cells LC_V1.

In FIG. 1, the first version logic cell LC_V1 and the second version logic cell LC_V2 are arranged alternately one by one along the width direction for only the one row R1. However, the plurality of logic cells LC constituting all rows R1, R2, . . . , R6 in the cell block 12 may each include the first version logic cell LC_V1 and the second version logic cell LC_V2 alternately arranged one by one along the width direction. Although FIG. 1 shows the cell block 12 including six rows R1, R2, . . . , R6, this is only an example. The cell block 12 may include various numbers of rows selected as needed and each row may include various numbers of logic cells selected as needed.

Figure 2:
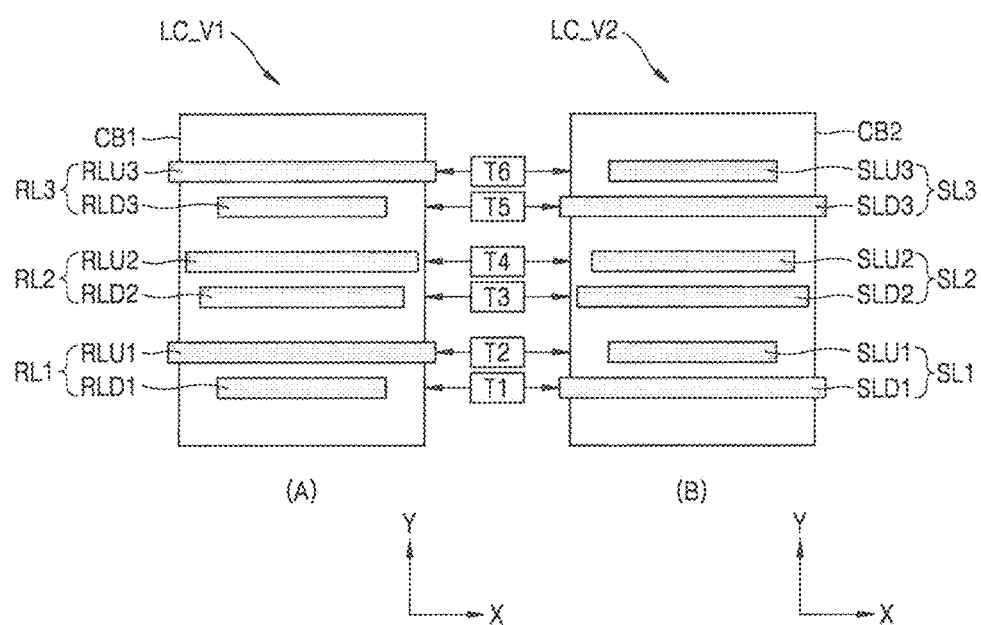
FIG. 2 is layout diagram of wiring structures of a first version logic cell and a second version logic cell included in a cell block of the integrated circuit device shown in FIG. 1.

FIG. 2 illustrates layout diagrams (A) and (B) of wiring structures of the first version logic cell LC_V1 and the second version logic cell LC_V2, respectively, included in the cell block 12 of the integrated circuit device 10 shown in FIG. 1.

The first version logic cell LC_V1 may have a first cell boundary CB1. The second version logic cell LC_V2 may have a second cell boundary CB2. The first version logic cell LC_V1 and the second version logic cell LC_V2 each may include a plurality of conductive lines extending along first through sixth wiring tracks T1, T2, . . . , T6 at the same level. The plurality of conductive lines may be a plurality of wiring layers extending in the same width direction (e.g., X direction). In some embodiments, the wiring layers may be unidirectional.

The first version logic cell LC_V1 may include a first pair of reference conductive lines RL1, a second pair of reference conductive lines RL2, and a third pair of reference conductive lines RL3. The first pair of reference conductive lines RL1 may include a first lower reference conductive line RLD1 and a first upper reference conductive line RLU1 that have different lengths in the width direction (X direction) of the first version logic cell LC_V. The first lower reference conductive line RLD1 may extend along the first wiring track T1. The first upper reference conductive line RLU1 may extend along the second wiring track T2. The first upper reference conductive line RLU1 may extend to the outside of the first version logic cell LC_V1 across the first cell boundary CB1. In some embodiments, an "upper" conductive line (e.g., RLU1) may be at a higher level in the logic cell (e.g., LC_V1) than a "lower" conductive line (e.g., RLD1).

The second pair of reference conductive lines RL2 may include a second lower reference conductive line RLD2 and a second upper reference conductive line RLU2 that have different lengths in the width direction (e.g., X direction) of the first version logic cell LC_V1. The second lower reference conductive line RLD2 may extend along the third wiring track T3. The second upper reference conductive line RLU2 may extend along the fourth wiring track T4.

The third pair of reference conductive lines RL3 may include a third lower reference conductive line RLD3 and a third upper reference conductive line RLU3 that have different lengths in the width direction (e.g., X direction) of the first version logic cell LC_V1. The third lower reference conductive line RLD3 may extend along the fifth wiring track T5. The third upper reference conductive line RLU3 may extend along the sixth wiring track T6. The third upper reference conductive line RLU3 may extend to the outside of the first version logic cell LC_V1 across the first cell boundary CB1.

The second version logic cell LC_V2 may include a first pair of swap conductive lines SL1, a second pair of swap conductive lines SL2, and a third pair of swap conductive lines SL3.

The first pair of swap conductive lines SL1 may include a first lower swap conductive line SLD1 and a first upper swap conductive line SLU1 that have different lengths in the width direction (e.g., X direction) of the second version logic cell LC_V2. The first lower swap conductive line SLD1 may extend along the first wiring track T1. The first upper swap conductive line SLU1 may extend along the second wiring track 12. The first lower swap conductive line SLD1 may extend to the outside of the second version logic cell LC_V2 across the second cell boundary CB2. The first lower swap conductive line SLD1 and the first upper swap conductive line SLU1 may have a mutually swapped arrangement structure with respect to the first upper reference conductive line RLU1 and the first lower reference conductive line RLD1, such that wiring structures in the first wiring track T1 and the second wiring track T2 of the first version logic cell LC_V are switched. Thus, the first lower swap conductive line SLD1 in the first wiring track T1 may have substantially the same arrangement structure and/or planar shape as the first upper reference conductive line RLU1 in the second wiring track T2 and have the same length along the width direction (e.g., X direction). In some embodiments, a planar shape of an object may refer to a shape of the object as seen from a plan view. The first upper swap conductive line SLU1 in the second wiring track T2 may have substantially the same arrangement structure and/or planar shape as the first lower reference conductive line RLD1 in the first wiring track T1 and have the same length along the width direction (e.g., X direction).

The second pair of swap conductive lines SL2 may include a second lower swap conductive line SLD2 and a second upper swap conductive line SLU2 that have different lengths in the width direction (e.g., X direction) of the second version logic cell LC_V2. The second lower swap conductive line SLD2 may extend along the third wiring track T3. The second upper swap conductive line SLU2 may extend along the fourth wiring track T4. The second lower swap conductive line SLD2 and the second upper swap conductive line SLU2 may have a mutually swapped arrangement structure with respect to the second upper reference conductive line RLU2 and the second lower reference conductive line RLD2, such that wiring structures are exchanged in a wiring track of each of the second lower reference conductive line RLD2 and the second upper reference conductive line RLU2 of the first version logic cell LC_V1. Thus, the second lower swap conductive line SLD2 in the third wiring track T3 may have substantially the same arrangement structure and/or planar shape as the second upper reference conductive line RLU2 in the fourth wiring track T4 and may have the same length along the width direction (e.g., X direction). The second upper swap conductive line SLU2 in the fourth wiring track T4 may have substantially the same arrangement structure and/or planar shape as the second lower reference conductive line RLD2 in the third wiring track T3 and may have the same length along the width direction (e.g., X direction).

The third pair of swap conductive lines SL3 may include a third lower swap conductive line SLD3 and a third upper swap conductive line SLU3 that have different lengths in the width direction (e.g., X direction) of the second version logic cell LC_V2. The third lower swap conductive line SLD3 may extend along the fifth wiring track T5. The third upper swap conductive line SLU3 may extend along the sixth wiring track T6. The third lower swap conductive line SLD3 may extend to the outside of the second version logic cell LC_V2 across the second cell boundary CB2. The third lower swap conductive line SLD3 and the third upper swap conductive line SLU3 of the third pair of swap conductive lines SL3 may have a mutually swapped arrangement structure such that wiring structures are exchanged in a wiring track of each of the third lower reference conductive line RLD3 and the third upper reference conductive line RLU3 of the first version logic cell LC_V1. Thus, the third lower swap conductive line SLD3 in the fifth wiring track T5 may have the same arrangement structure and/or planar shape as the third upper reference conductive line RLU3 in the sixth wiring track T6 and have the same length along the width direction (e.g., X Direction). The third upper swap conductive line SLU3 in the sixth wiring track T6 may have substantially the same arrangement structure and/or planar shape as the third lower reference conductive line RLD3 in the fifth wiring track T5 and have the same length along the width direction (e.g., X direction).

Figure 3:
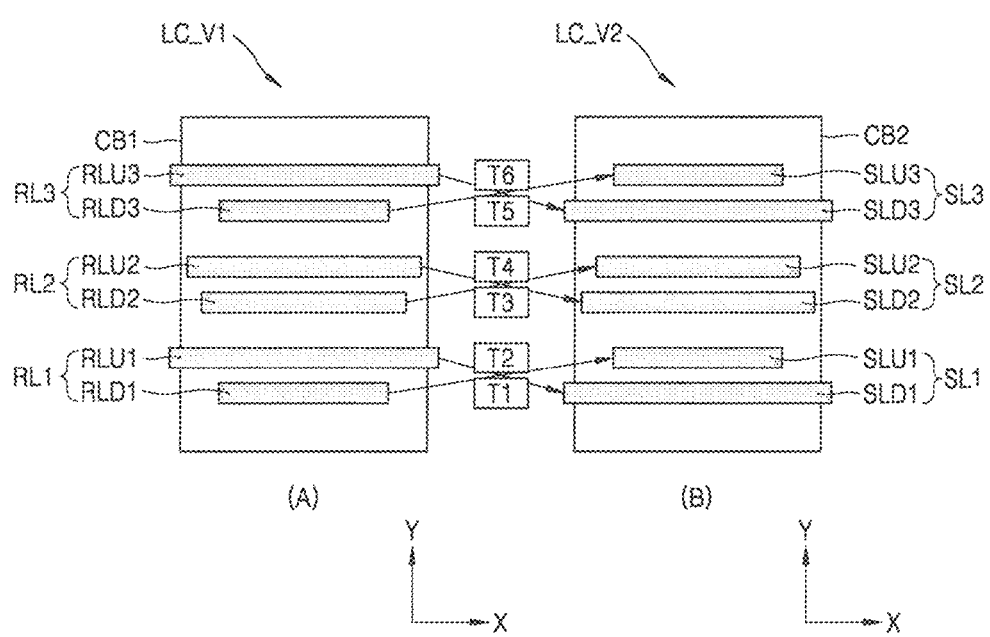
FIG. 3 is a view for explaining a process of forming layouts of first to third pairs of swap conductive lines of the second version logic cell shown in FIG. 2.

FIG. 3 is a view for explaining a process of forming layouts of first to third pairs of swap conductive lines SL1, SL2 and SL3 of the second version logic cell LC_V2 shown in FIG. 2.

Referring to FIG. 3, the layout of the first to third pairs of swap conductive lines SL1, SL2, and SL3 of the second version logic cell LC_V2 may be obtained from first to third pair of reference conductive lines RL1, RL2, and RL3 of the first version logic cell LC_V1. That is, in order to form the layout of the first pair of swap conductive lines SL1 of the second version logic cell LC_V2, a layout of the first lower swap conductive line SLD1 disposed in the first wiring track T1 of the second version logic cell LC_V2 may be designed to be the same as a layout of the first upper reference conductive line RLU1 disposed in the second wiring track T2 of the first version logic cell LC_V1, and a layout of the first upper swap conductive line SLU1 disposed in the second wiring track T2 of the second version logic cell LC_V2 may be designed to be the same as a layout of the first lower reference conductive line RLD1 disposed in the first wiring track T1 of the first version logic cell LC_V1. Similarly, the layouts of the second and third pairs of swap conductive lines SL2 and SL3 of the second version logic cell LC_V2 may be formed by using the second and third pairs of reference conductive lines RL2 and RL3 of the first version logic cell LC_V1.

Figure 4:
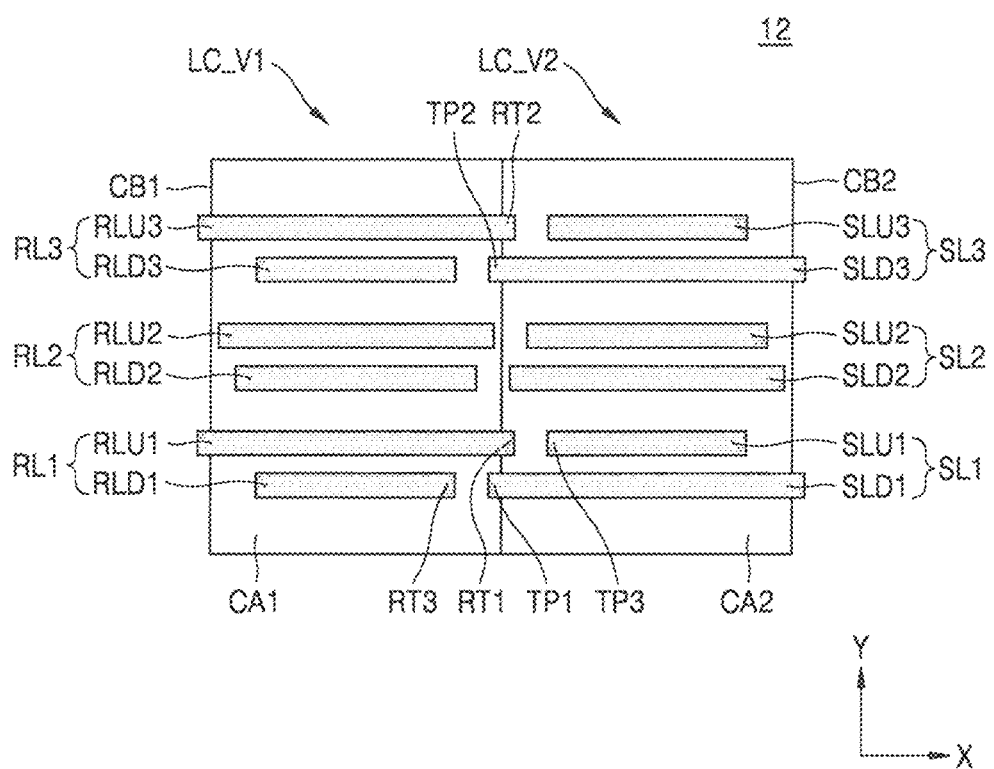
FIG. 4 is a plan view showing an example configuration of a local region of the cell block of FIG. 1.

FIG. 4 is a plan view showing an example configuration of a local region of the cell block 12 of FIG. 1. FIG. 4 illustrates the first version logic cell LC_V1 and the second version logic cell LC_V2 arranged adjacent to each other.

Referring to FIG. 4, the first cell boundary CB1 of the first version logic cell LC_V1 and the second cell boundary CB2 of the second version logic cell LC_V2 may partially overlap each other.

The first upper reference conductive line RLU1 and the third upper reference conductive line RLU3 of the first version logic cell LC_V1 may respectively include tip portions RT1 and RT2 extending to a second logic cell region CA2 across the first cell boundary CB1 from the inside of a first logic cell region CA1 defined by the first cell boundary CB1.

The first lower swap conductive line SLD1 and the third lower swap conductive line SLD3 of the second version logic cell LC_V2 may respectively include corresponding tip portions TP1 and TP2 extending to the first logic cell region CA1 across the second cell boundary CB2 from the inside of the second logic cell region CA2 defined by the second cell boundary CB2.

The first lower reference conductive line RLD1 in the first wiring track T1 (see FIG. 2) of wiring lines of the first version logic cell LC_V1 may extend along a line extending from the first lower swap conductive line SLD1. In some embodiments, the first lower reference conductive line RLD1 may extend collinear with the first lower swap conductive line SLD1. The first lower reference conductive line RLD1 may include a tip portion RT3 facing the corresponding tip portion TP1 of the first lower swap conductive line SLD1 at a position spaced apart from the corresponding tip portion TP1 of the first lower swap conductive line SLD1. The position of the tip portion RT3 may be sufficiently apart from the first cell boundary CB1 in the first logic cell region CA1, and thus a sufficient insulation distance may be obtained between the tip portion RT3 and the corresponding tip portion TP1.

The first upper swap conductive line SLU1 in the second wiring track T2 (see FIG. 2) of wiring lines of the second version logic cell LC_V2 may extend along a line extending from the first upper reference conductive line RLU1 (e.g., extending collinearly) and may include a corresponding tip portion TP3 facing the tip portion RT1 of the first upper reference conductive line RLU1 at a position spaced apart from the tip portion RT1 of the first upper reference conductive line RLU1. The position of the corresponding tip portion TP3 may be sufficiently apart from the second cell boundary CB2 in the second logic cell region CA2, and thus a sufficient insulation distance may be obtained between the tip portion RT1 and the corresponding tip portion TP3.

As such, when the first pair of reference conductive lines RL1 and the first pair of swap conductive lines SL1 include conductive lines extending respectively beyond the first and second logic cell regions CA1 and CA2 across the first and second cell boundaries CB1 and CB2, a sufficient insulation distance may be obtained between the first pair of reference conductive lines RL1 and the first pair of swap conductive lines SL1, and thus a short circuit therebetween may be prevented. Similarly, a sufficient insulation distance may be obtained between the second pair of reference conductive lines RL2 and the second pair of swap conductive lines SL2, and between the third pair of reference conductive lines RL3 and the third pair of swap conductive lines SL3. Thus, a short circuit therebetween may be prevented.

Although an example of the second version logic cell LC_V2 including three pairs of swap conductive lines whose wiring structures in each wiring track are swapped for three pairs of reference conductive lines is described with reference to FIGS. 2 to 4, the inventive concepts are not limited thereto. For example, an integrated circuit device according to the inventive concepts may include a second version logic cell LC_V2 including at least one pair of swap conductive lines whose wiring structures are swapped in a wiring track of each of at least one pair of reference conductive lines selected from the first version logic cell LC_V1 as needed.

Figure 5A:
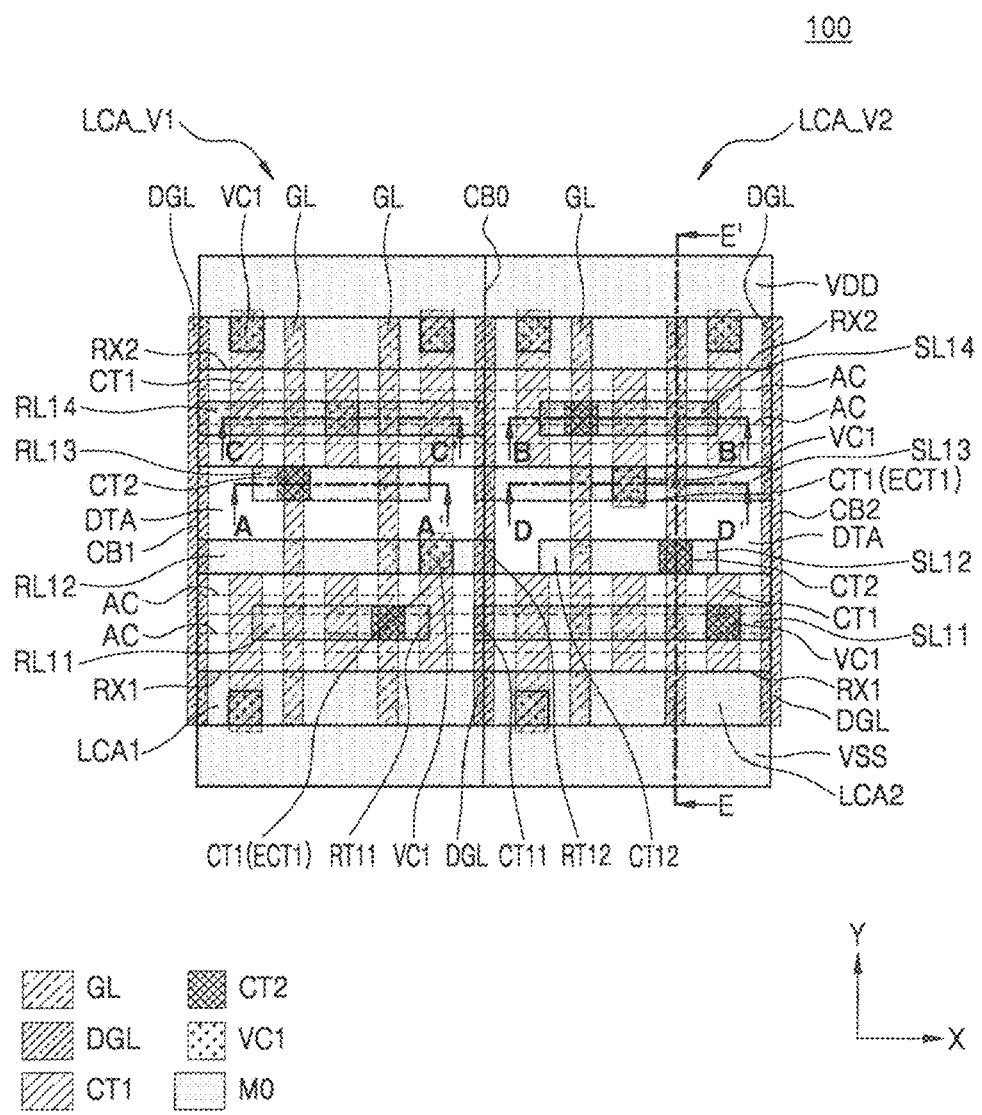
FIG. 5A is a planar layout diagram showing a main configuration of an integrated circuit device according to embodiments of the inventive concepts.
Figure 5B:
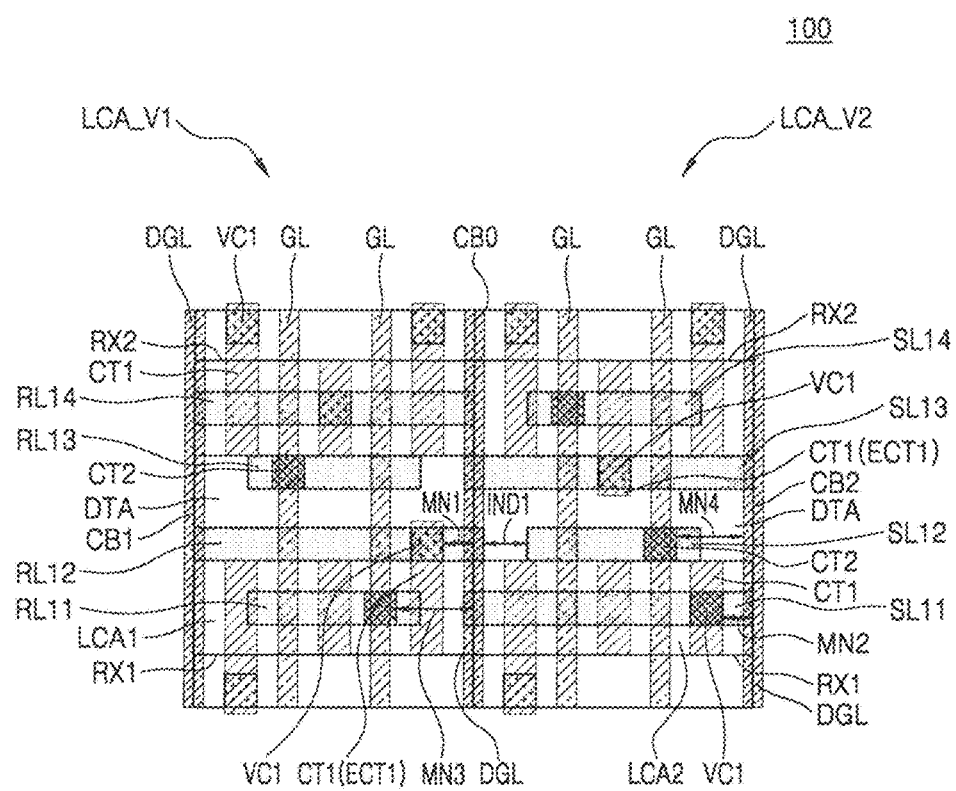
FIG. 5B is a planar layout diagram showing an excerpt of a partial configuration of the integrated circuit device illustrated in FIG. 5A.
Figure 6A:
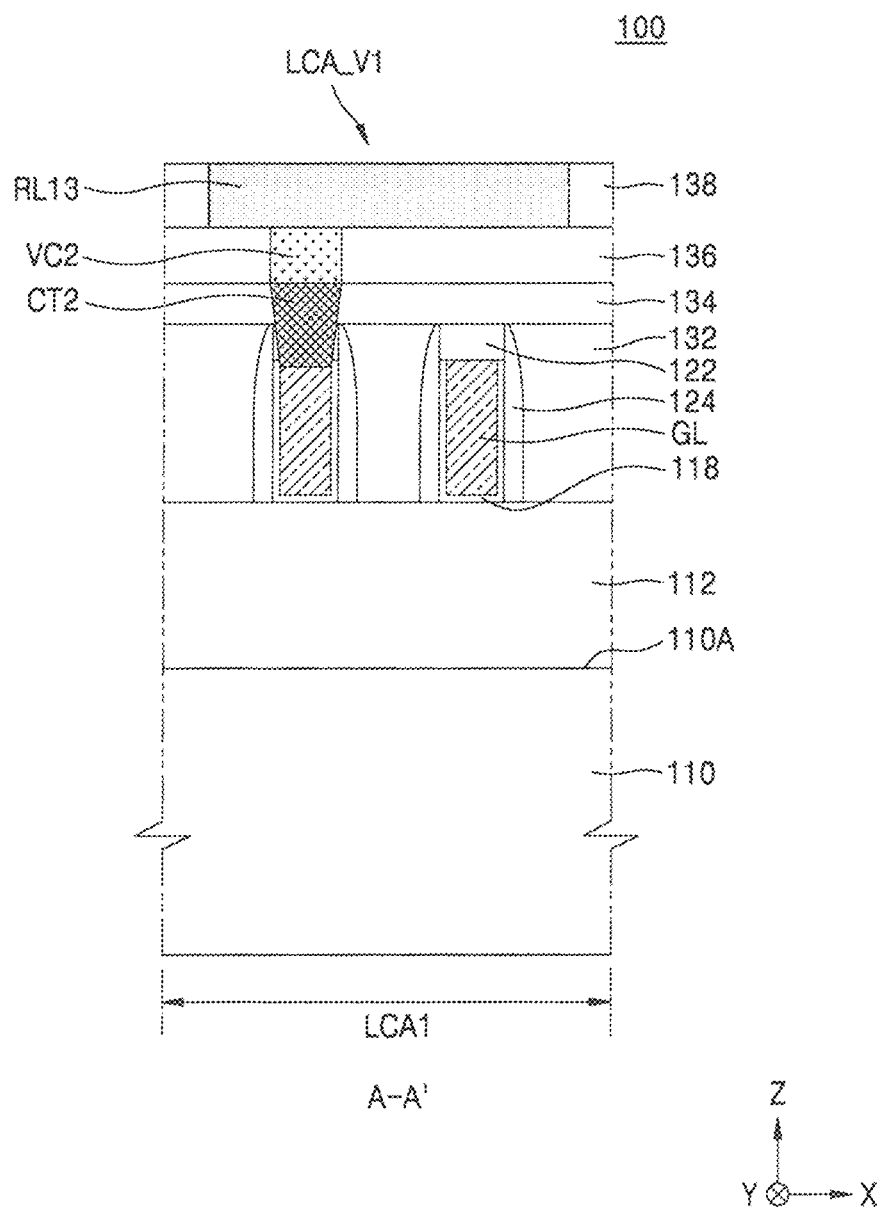
Figure 6B:
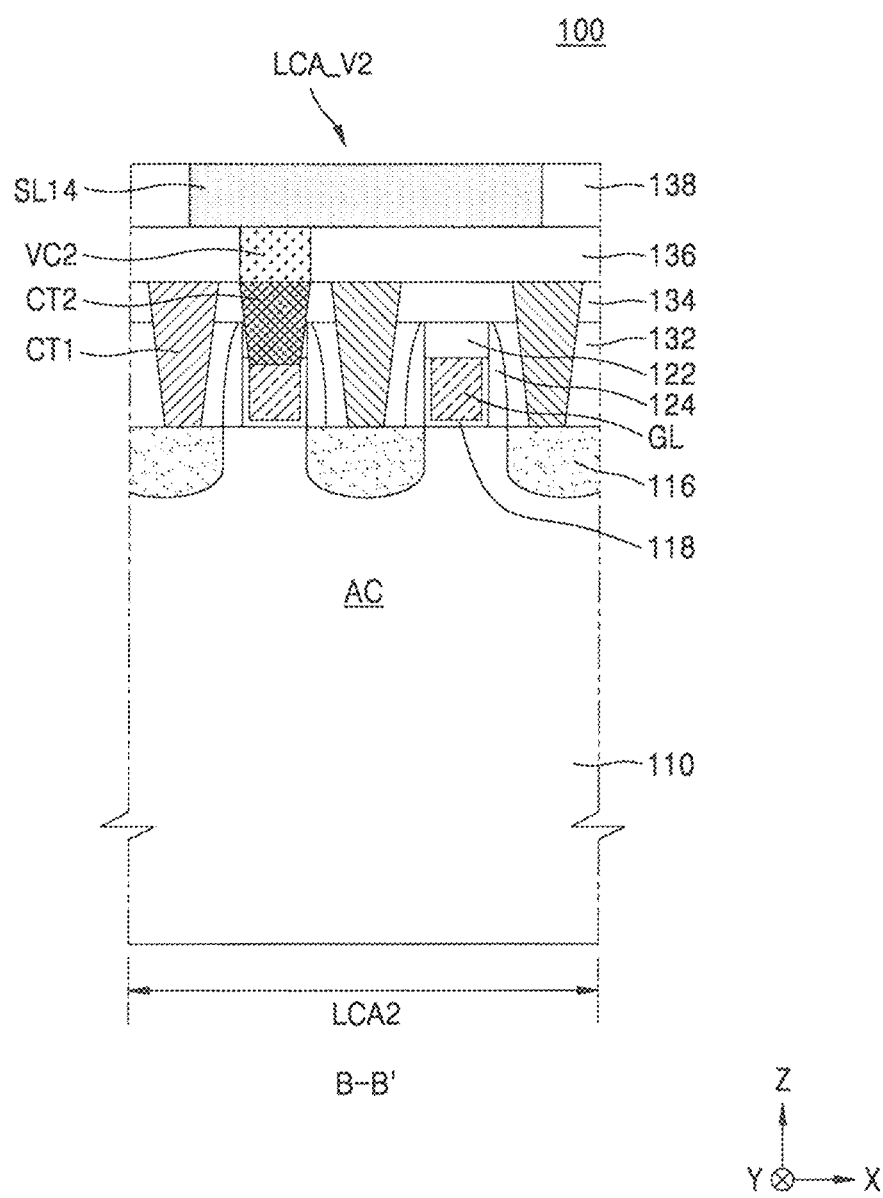
Figure 6C:
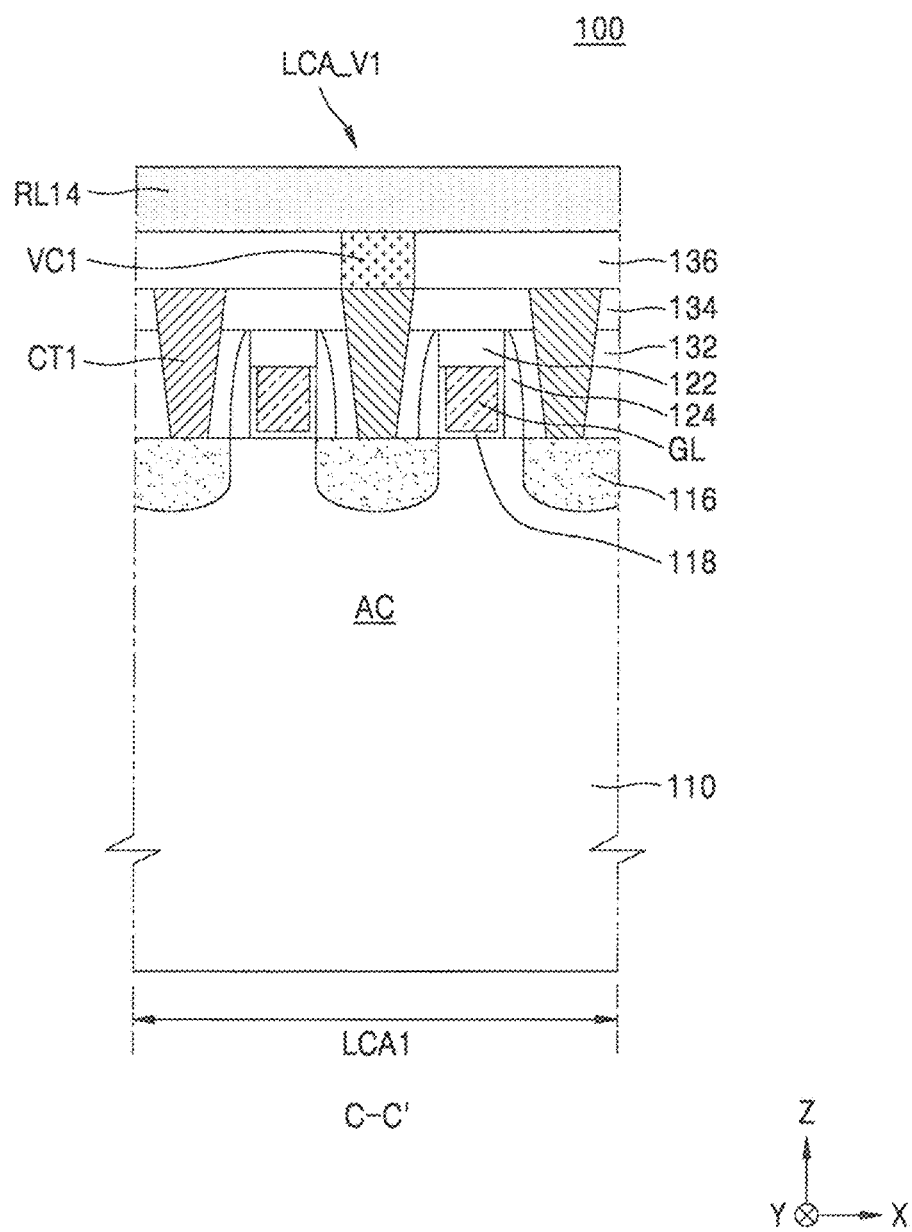
Figure 6D:
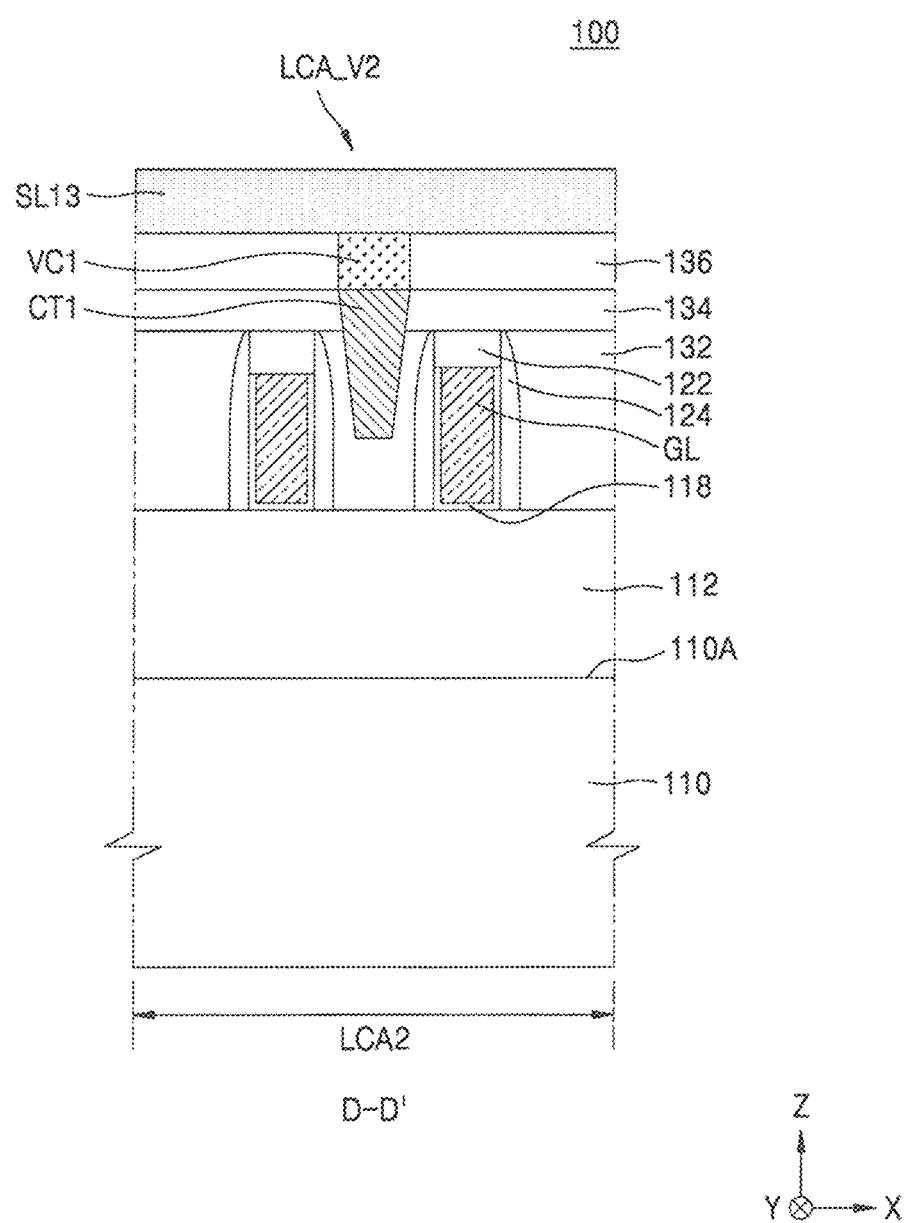

FIG. 5A is a planar layout diagram showing a main configuration of an integrated circuit device 100 according to embodiments of the inventive concepts. FIG. 5B is a planar layout diagram showing an excerpt of a partial configuration of the integrated circuit device 100 illustrated in FIG. 5A. FIGS. 6A to 6E are cross-sectional views taken along line A-A', line B-B', line C-C', line D-D', and line E-E', respectively, in FIG. 5A.

An example configuration of the integrated circuit device 100 having four M0 wiring tracks in a 6T logic cell, including a fin field effect transistor (FinFET) element and having a cell height corresponding to six wiring lines having a minimum wiring width is described with reference to FIGS. 5A to 6E. In the present specification, the term "M0 wiring" refers to wirings formed at a level that is closest to a plurality of gate lines among a multilayer wiring structure formed on the plurality of gate lines. A plurality of conductive lines constituting the M0 wiring may be a plurality of wiring layers extending in parallel to each other in a direction intersecting an extending direction of the plurality of gate lines. In some embodiments, the wiring layers may be unidirectional.

Referring to FIGS. 5A to 6E, the integrated circuit devices 100 may include a first version logic cell LCA_V1 and a second version logic cell LCA_V2 disposed adjacent to each other in a width direction (e.g., X direction) on a substrate 110 and performing the same or similar function as each other.

The first cell boundary CB1 defining a first logic cell region LCA1 of the first version logic cell LCA_V1 and the second cell boundary CB2 defining a second logic cell region LCA2 of the second version logic cell LCA_V2 may overlap each other in a cell boundary CB0 extending along a height direction (e.g., Y direction).

The substrate 110 has a main surface 110A extending in a horizontal direction (e.g., X-Y planar direction). The substrate 110 may include a semiconductor such as Si or Ge, or a compound semiconductor such as, for example, SiGe, SiC, GaAs, InAs, or InP. The substrate 110 may include a conductive region, for example, a well doped with an impurity, or a structure doped with an impurity.

The first version logic cell LCA_V1 and the second version logic cell LCA_V2 may each include a first device region RX1 and a second device region RX2 in which a plurality of fin-type active regions AC protruding from the substrate 110 are formed. In the first version logic cell LCA_V1 and the second version logic cell LCA_V2, an inter-device isolation region DTA may be disposed between the first device region RX1 and the second device region RX2.

The plurality of fin-type active regions AC may extend in parallel to each other along the width direction (e.g., X direction). A device isolation layer 112 may be formed between the plurality of fin-type active regions AC, and the plurality of fin-type active regions AC may protrude above the device isolation layer 112 in a fin shape.

A plurality of gate insulating layers 118 and a plurality of gate lines GL may extend in a direction (e.g., Y direction) intersecting the plurality of fin-type active regions AC on the substrate 110. The plurality of gate insulating layers 118 and the plurality of gate lines GL may extend while covering an upper surface and both sidewalls of each of the plurality of fin-type active regions AC and an upper surface of the device isolation layer 112. A plurality of MOS transistors may be formed along the plurality of gate lines GI, in the first device region RX1 and the second device region RX2. The plurality of MOS transistors may each be composed of a MOS transistor of a three-dimensional structure in which a channel is formed on the upper surfaces and both sidewalls of the plurality of fin-type active regions AC.

A dummy gate line DGL may extend along portions of the first cell boundary CB1 and the second cell boundary CB2 that extend along a height direction (e.g., Y direction). The dummy gate line DGL may also be disposed in the cell boundary CB0 where the first cell boundary CB1 and the second cell boundary CB2 overlap each other. The dummy gate line DGL may include the same material as the plurality of gate lines GL but may remain in an electrical floating state during an operation of the integrated circuit device 100, and thus the dummy gate line DGL may function as an electrical isolation region between the first version logic cell LCA_V1 and the second version logic cell LCA_V2. The dummy gate line DGL extending along the cell boundary CB0 may cover a part of the first logic cell region LCA1 and a part of the second logic cell region LCA2.

The plurality of gate lines GL and the plurality of dummy gate lines DGL may have the same width in the width direction (e.g., X direction) and may be arranged at a constant pitch along the width direction (e.g., X direction). That is, in the width direction (e.g., X direction), a spaced distance between adjacent two gate lines GL among the plurality of gate lines GL constituting the first version logic cell LCA_V and a spaced distance between adjacent two gate lines GL among the gate lines GL constituting the second version logic cell LCA_V2 may be equal to each other. A spaced distance between the gate line GL closest to the cell boundary CB0 among the plurality of gate lines GL constituting the first version logic cell LCA_V1 and the dummy gate line DGL extending along the cell boundary CB0 may be equal to a spaced distance between the gate line GL closest to the cell boundary CB0 among the gate lines GL constituting the second version logic cell LCA_V2 and the dummy gate line DGL extending along the cell boundary CB0.

In the first version logic cell LCA_V1 and the second version logic cell LCA_V2, the plurality of gate insulating layers 118 may be formed of a silicon oxide layer, a high-k layer, or a combination thereof. The high-k layer may be made of a material having a dielectric constant larger than that of the silicon oxide layer. For example, the gate insulating layer 118 may include a metal oxide and/or a metal oxynitride having a dielectric constant of about 10 to about 25. For example, the high-k dielectric layer may be made of hafnium oxide, but the inventive concepts are not limited thereto.

In the first version logic cell LCA_V1 and the second version logic cell LCA_V2, the plurality of gate lines GL and the plurality of dummy gate lines DGL may have a structure in which a metal nitride layer, a metal layer, a conductive capping layer, and a gap-fill layer are sequentially stacked. The metal nitride layer and the metal layer may include at least one metal selected from Ti, Ta, W, Ru, Nb, Mo, and Hf. The gap-fill metal layer may be formed of a W layer and/or an Al layer. The plurality of gate lines GL and the plurality of dummy gate lines DGL may each include a work function metal containing layer. The work function metal containing layer may include at least one metal selected from Ti, W, Ru, Nb, Mo, Hf, Ni, Co, Pt, Yb, Tb, Dy, Er and Pd. The plurality of gate lines GL and the plurality of dummy gate lines DGL may include a stack structure of TiAlC/TiN/W, a stack structure of TiN/TaN/TiAlC/TiN/W, or a stack structure of TiN/TaN/TiN/TiAlC/TiN/W, but the inventive concepts are not limited thereto. Each of the plurality of gate lines GL has a top surface covered by an insulating capping pattern 122 and sidewalls covered by an insulating spacer 124. Each of the insulating capping pattern 122 and the insulating spacer 124 may be formed of a silicon nitride layer.

A plurality of source/drain regions 116 may be formed on the plurality of fin-type active regions AC. The plurality of source/drain regions 116 may be connected to conductive lines constituting the M0 wiring through a source/drain contact plug CT1 and a first via contact VC1. The plurality of gate lines GL may be connected to conductive lines constituting the M0 wiring through a gate contact plug CT2 and a second via contact VC2.

In the first version logic cell LCA_V1, the M0 wiring may include first through fourth reference conductive lines RL11, RL12, RL13, and RL14 sequentially arranged along a height direction (e.g., Y direction) of the first version logic cell LCA_V1. In the second version logic cell LCA_V2, the M0 wiring may include first through fourth swap conductive lines SL11, SL12, SL13, and SL14 sequentially arranged along a height direction (e.g., Y direction) of the second version logic cell LCA_V2. The first swap conductive line SL11 may be arranged in a wiring track having the same height as the first reference conductive line RL11. The second swap conductive line SL12 may be arranged in a wiring track having the same height as the second reference conductive line RL12. The third swap conductive line SL13 may be arranged in a wiring track having the same height as the third reference conductive line RL13. The fourth swap conductive line SL14 may be arranged in a same wiring track having the same height as the fourth reference conductive line RL14.

The plurality of source/drain contact plugs CT1 and the plurality of gate contact plugs CT2 may be mutually insulated by a first interlayer insulating layer 132 on and, in some embodiments, covering, the plurality of fin-type active regions AC and the plurality of gate lines GL. The plurality of source/drain contact plugs CT1 and the plurality of gate contact plugs CT2 may be mutually insulated by a second interlayer insulating layer 134. The plurality of first via contacts VC1 and the plurality of second via contacts VC2 may be mutually insulated by a third interlayer insulating layer 136. The first to fourth reference conductive lines RL11, RL12, RL13, and RL14 constituting the M0 wiring and the first to fourth swap conductive lines SL11, SL12, SL13, and SL14 may be disposed on the third interlayer insulating layer 136 and may be mutually insulated by the fourth interlayer insulating layer 138. The first to fourth reference conductive lines RL11, RL12, RL13, and RL14 and the first to fourth swap conductive lines SL11, SL12, SL13 and SL14 may include wiring layers extending in parallel to each other in the width direction (e.g., X direction). In some embodiments, the wiring layers may be unidirectional. The first to fourth interlayer insulating layers 132, 134, 136, and 138 may be formed of a silicon oxide layer.

In the first version logic cell LCA_V1 and the second version logic cell LCA_V2, a ground line VSS may be connected to the active region AC in the first device region RX1 through the source/drain contact plug CT1, and a power line VDD may be connected to the active region AC in the second device region RX2 through the source/drain contact plug CT1. The ground line VSS and the power line VDD may extend in parallel to each other with the first to fourth reference conductive lines RL11, RL12, RL13 and RL14 constituting the M0 wiring and the first to fourth swap conductive lines SL11, SL12, SL13 and SL14. The ground line VSS and the power line VDD may be formed simultaneously with the first to fourth reference conductive lines RL11, RL12, RL13, and RL14 and the first to fourth swap conductive lines SL11, SL12, SL13, and SL14. A height of each of the first version logic cell LCA_V1 and the second version logic cell LCA_V2 may be defined along a shortest distance direction (Y direction) between the ground line VSS and the power line VDD.

The first to fourth reference conductive lines RL11, RL12, RL13, and RL14, the first to fourth swap conductive lines SL11, SL12, SL13, and SL14, the ground line VSS, and the power line VDD may each include a barrier layer and a wiring conductive layer. The barrier layer may be made of TiN, TaN, or a combination thereof. The wiring conductive layer may be made of Co, Cu, W, an alloy thereof, or a combination thereof. A CVD, an ALD, and/or an electroplating process may be used to form the first to fourth reference conductive lines RL11, RL12, RL13, and RL14, the first to fourth swap conductive lines SL11, SL12, SL13, and SL14, the ground line VSS, the power line VDD, the first via contact VC1, and/or the second via contact VC2 therebelow.

The first and second reference conductive lines RL11 and RL12 of the first version logic cell LCA_V1 and the first and second swap conductive lines SL11 and SL12 of the second version logic cell LCA_V2 may have an arrangement structure in which wiring structures in wiring tracks adjacent to each other are swapped. Accordingly, the first reference conductive line RL11 and the second swap conductive line SL12 may have substantially the same arrangement structure, planar shape, and/or length. In addition, the second reference conductive line RL12 and the first swap conductive line SL11 may have substantially the same arrangement structure, planar shape, and/or length.

The second reference conductive line RL12 may include a tip portion RT12 extending into the second logic cell region LCA2 across the cell boundary CB0 from the inside of the first logic cell region LCA1. The second swap conductive line SL12 arranged to extend along a line extending from the second reference conductive line RL12 (e.g., extending collinearly) may be disposed apart from the cell boundary CB0 and include a corresponding tip portion CT12 facing the tip portion RT12 at a spaced position so as to secure a sufficient insulation distance IND1 (see FIG. 5B) from the tip portion RT12. As such, the second reference conductive line RL12 may include the tip portion RT12 extending into the second logic cell region LCA2 while ensuring the sufficient insulation distance IND1 between the second reference conductive line RL12 and the second swap conductive line SL12 adjacent thereto. In some embodiments, a sufficient contact margin between the second reference conductive line RL12 and the first via contact VC1 may be secured although the first via contact VC1 for connecting the second reference conductive line RL12 and the source/drain contact plug CT1 is formed at a relatively short distance from the cell boundary CB0. In this regard, the source/drain contact plug CT1 connected to the second reference conductive line RL12 through the first via contact VC1 among the plurality of source/drain contact plugs CT1 may include a source/drain contact plug ECT1 having a further extending length along the height direction (e.g., Y direction) compared to the other source/drain contact plugs CT1. As illustrated in FIGS. 5A and 5B, the extended source/drain contact plug ECT1 may extend over the first device region RX1 and the inter-device isolation region DTA.

The first reference conductive line RL11 may be disposed apart from the cell boundary CB0 and may include a tip portion RT11 facing the second logic cell region LCA2. The first swap conductive line SL11 arranged to extend on a line extending from the first reference conductive line RL11 (e.g., collinearly) may include a corresponding tip portion CT11 extending into the first logic cell LCA1 across the cell boundary CB0. The corresponding tip portion CT11 of the first swap conductive line SL11 may face the tip portion RT11 of the first reference conductive line R11.

The dummy gate line DGL extending along the cell boundary CB0 may include a portion under and/or vertically overlapping (e.g., in a direction perpendicular to the X and Y direction) with the tip portion RT2 of the second reference conductive line RL12 and a portion under and/or vertically overlapping (e.g., in a direction perpendicular to the X and Y direction) with the corresponding tip portion CT11 of the first swap conductive line SL11.

Referring to FIG. 5B, a minimum distance MN1 between the first via contact VC1 connected to the second reference conductive line RL12 and the first cell boundary CB1 may be the same as a minimum distance MN2 between the first via contact VC1 connected to the first swap conductive line SL11 and the second cell boundary CB2. The source/drain contact plug CT1 connected to the second reference conductive line RL12 via the first via contact VC1 may include the extended source/drain contact plug ECT1 as described above. Thus, a length of the source/drain contact plug CT1 connected to the second reference conductive line RL12 through the first via contact VC1 may be greater than a length of the source/drain contact plug CT1 connected to the first swap conductive line SL11 through the first via contact VC1 along the height direction (e.g., Y direction).

A minimum distance MN3 between the first cell boundary CB1 and the gate contact plug CT2 connected between the first reference conductive line RL11 and the gate line GL may be the same as a minimum distance MN4 between the second cell boundary CB2 and the gate contact plug CT2 connected between the second swap conductive line SL12 and the gate line GL.

The third and fourth reference conductive lines RL13 and RL14 of the first version logic cell LCA_V1 and the third and fourth swap conductive lines SL13 and SL14 of the second version logic cell LCA_V2 may have an arrangement structure in which wiring structures in two wiring tracks adjacent to each other are swapped. Accordingly, the third reference conductive line RL13 and the fourth swap conductive line SL14 may have substantially the same arrangement structure, planar shape, and/or length. In addition, the fourth reference conductive line RL14 and the third swap conductive line SL13 may have substantially the same arrangement structure, planar shape, and/or length.

The dummy gate line DGL extending along the cell boundary CB0 may include a portion under and/or vertically overlapping with the fourth reference conductive line RL14 and a portion under and/or vertically overlapping with the third swap conductive line SL13.

The source/drain contact plug CT1 connected to the third swap conductive line SL13 via the first via contact VC1 may include the extended source/drain contact plug ECT1. Thus, a length of the source/drain contact plug CT1 connected to the third swap conductive line SL13 through the first via contact VC1 may be greater than a length of the source/drain contact plug CT1 connected to the fourth reference conductive line RL14 via the first via contact VC1 along the height direction (e.g., Y direction).

The first version logic cell LCA_V1 and the second version logic cell LCA_V2 illustrated in FIGS. 5A through 6E may constitute a part of the cell block 12 illustrated in FIG. 1.

Figure 7:
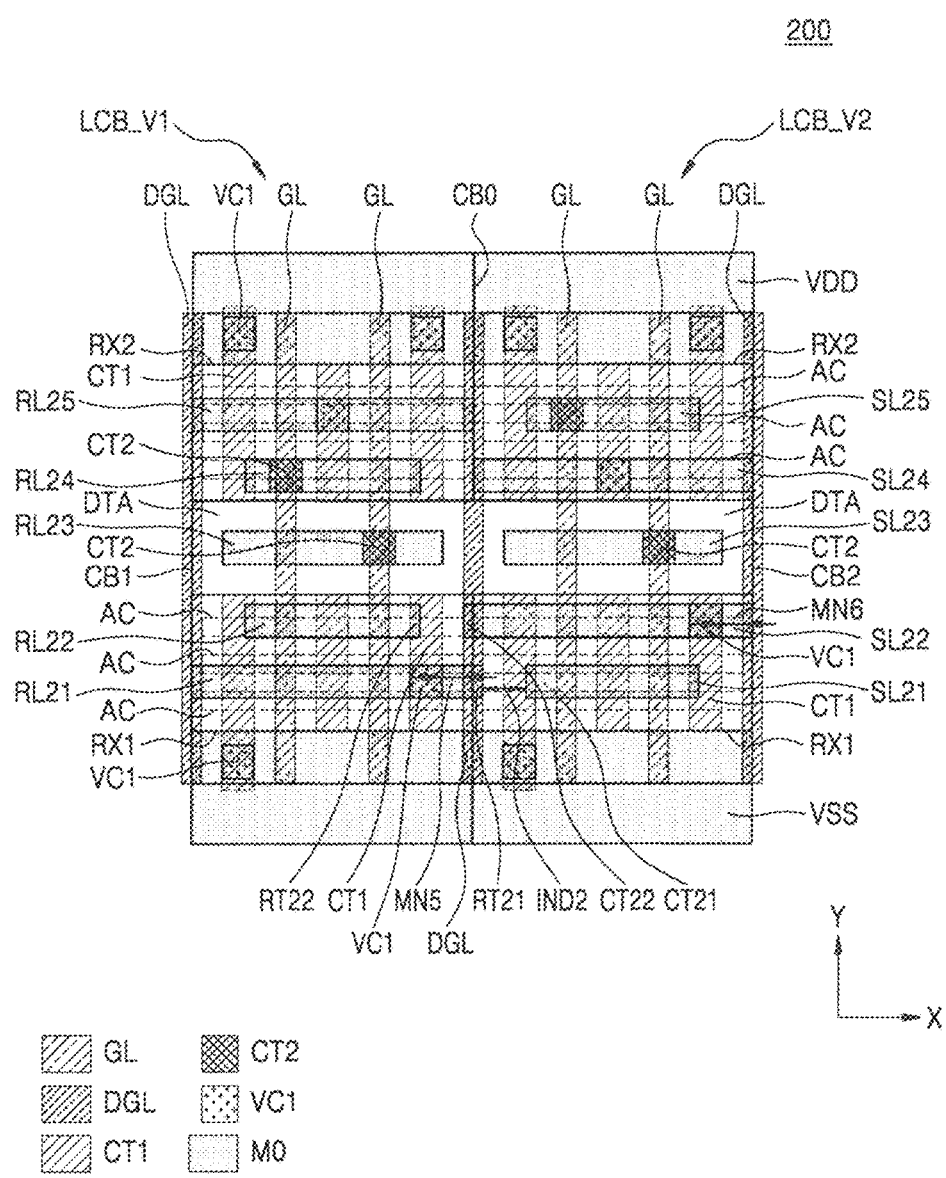
FIG. 7 is a planar layout diagram showing a main configuration of an integrated circuit device according to other embodiments of the inventive concepts.

FIG. 7 is a planar layout diagram showing a main configuration of an integrated circuit device 200 according to other embodiments of the inventive concepts. An example configuration of the integrated circuit device 200 having five M0 wiring tracks in a 7.5T logic cell will be described with reference to FIG. 7.

Referring to FIG. 7, the dummy gate line DGL may extend along the cell boundary CB0 of a first version logic cell LCB_V1 and a second version logic cell LCB_V2 disposed adjacent to each other in a width direction (e.g., X direction) in the integrated circuit device 200. The first version logic cell LCB_V1 and the second version logic cell LCB_V2 may perform the same or similar function.

In the first version logic cell LCB_V1 and the second version logic cell LCB_V2, three fin-type active regions AC may extend in each of the first device region RX1 and the second device region RX2 in a width direction (e.g., X direction). In the first version logic cell LCB_V1 and the second version logic cell LCB_V2, an inter-device isolation region DTA may be disposed between the first device region RX1 and the second device region RX2.

In the first version logic cell LCB_V1, the M0 wiring may include first through fifth reference conductive lines RL21, RL22, RL23, RL24, and RL25 sequentially arranged along a height direction (e.g., Y direction) of the first version logic cell LCB_V1. In the second version logic cell LCB_V2, the M0 wiring may include first through fifth swap conductive lines SL21, SL22, SL23, SL24, and SL25 sequentially arranged along a height direction (e.g., Y direction) of the second version logic cell LCB_V2. The first swap conductive line SL21 may be disposed on a wiring track having the same height as the first reference conductive line RL21. The second swap conductive line SL22 may be disposed on a wiring track having the same height as the second reference conductive line RL22. The third swap conductive line SL23 may be arranged in a wiring track having the same height as the third reference conductive line RL23. The fourth swap conductive line SL24 may be arranged on a wiring track having the same height as the fourth reference conductive line RL24. The fifth swap conductive line SL25 may be disposed on a wiring track having the same height as the fifth reference conductive line RL25.

The ground line VSS and the power line VDD may extend in parallel to the first to fifth reference conductive lines RL21, RL22, RL23, RL24, and RL25 and the first to fifth swap conductive lines SL21, SL22, SL23, SL24, and SL25 at the same level. Forming materials and forming methods of the first to fifth reference conductive lines RL21, RL22, RL23, RL24, and RL25 and the first to fifth swap conductive lines SL21, SL22, SL23, SL24, and SL25 are substantially the same as described with reference to FIGS. 5A to 6E with respect to the first to fourth reference conductive lines RL11, RL12, RL13, and RL14 and the first to fourth swap conductive lines SL11, SL12, SL13, and SL14.

The first and second reference conductive lines RL21 and RL22 of the first version logic cell LCB_V1 and the first and second swap conductive lines SL21 and SL22 of the second version logic cell LCB_V2 may have an arrangement structure in which wiring structures in two wiring tracks adjacent to each other are swapped. Accordingly, the first reference conductive line RL21 and the second swap conductive line SL22 may have substantially the same arrangement, planar shape and/or length, and the second reference conductive line RL22 and the first swap conductive line SL21 may have substantially the same arrangement structure, planar shape, and/or length.

The first reference conductive line RL21 may include a tip portion RT21 that extends into the second cell boundary CB2 of the second version logic cell LCB_V2 across the cell boundary CB0. The first swap conductive line SL21 may extend along a line extending from the first reference conductive line RL21 (e.g., extending collinearly) and may be disposed apart from the cell boundary CB0 and include a corresponding tip portion CT21 facing the tip portion RT21 at a spaced apart position so as to secure a sufficient insulation distance IND2 from the tip portion RT21. As such, the first reference conductive line RL21 may include the tip portion RT21 extending into the second version logic cell LCB_V2 while ensuring the sufficient insulation distance IND2 between the first reference conductive line RL21 and the first swap conductive line SL21 adjacent thereto. In some embodiments, a sufficient contact margin between the first reference conductive line RL21 and the first via contact VC1 may be secured although the first via contact VC1 for connecting the first reference conductive line RL21 and the source/drain contact plug CT1 may be formed at a relatively short distance from the cell boundary CB0.

The second reference conductive line RL22 may include a tip portion RT22 spaced from the cell boundary CB0 and disposed in the first cell boundary CB1 and facing the second swap conductive line SL22 of the second version logic cell LCB_V2. The second swap conductive line SL22 may extend along a line extending from the second reference conductive line RL22 and may include a corresponding tip portion CT22 extending into the first version logic cell LCB_V1 across the cell boundary CB0. The corresponding tip portion CT22 of the second swap conductive line SL22 may face the tip portion RT22 of the second reference conductive line RL22.

The dummy gate line DGL extending along the cell boundary CB0 may include a portion under and/or vertically overlapping (e.g., in a direction perpendicular to the X and Y direction) with the tip portion RT21 of the first reference conductive line RL21 and a portion under and/or vertically overlapping (e.g., in a direction perpendicular to the X and Y direction) with the corresponding tip portion CT22 of the second swap conductive line SL22.

A minimum distance MN5 between the first via contact VC1 connected to the first reference conductive line RL21 and the first cell boundary CB1 may be equal to a minimum distance MN6 between the first via contact VC1 connected to the second swap conductive line SL22 and the second cell boundary CB2.

The fourth and fifth reference conductive lines RL24 and RL25 of the first version logic cell LCB_V1 and the fourth and fifth swap conductive lines SL24 and SL25 of the second version logic cell LCB_V2 may have an arrangement structure in which wiring structures in two wiring tracks adjacent to each other are swapped. Accordingly, the fourth reference conductive line RL24 and the fifth swap conductive line SL25 may have substantially the same layout structure, planar shape, and/or length. In addition, the fifth reference conductive line RL25 and the fourth swap conductive line SL24 may have substantially the same arrangement structure, planar shape, and/or length.

The dummy gate line DGL extending along the cell boundary CB0 may include a portion under and/or vertically overlapping (e.g., in a direction perpendicular to the X and Y direction) with the fifth reference conductive line RL25 and a portion under and/or vertically overlapping (e.g., in a direction perpendicular to the X and Y direction) with the fourth swap conductive line SL24.

The first version logic cell LCB_V1 and the second version logic cell LCB_V2 illustrated in FIG. 7 may constitute a part of the cell block 12 illustrated in FIG. 1.

Figure 8A:
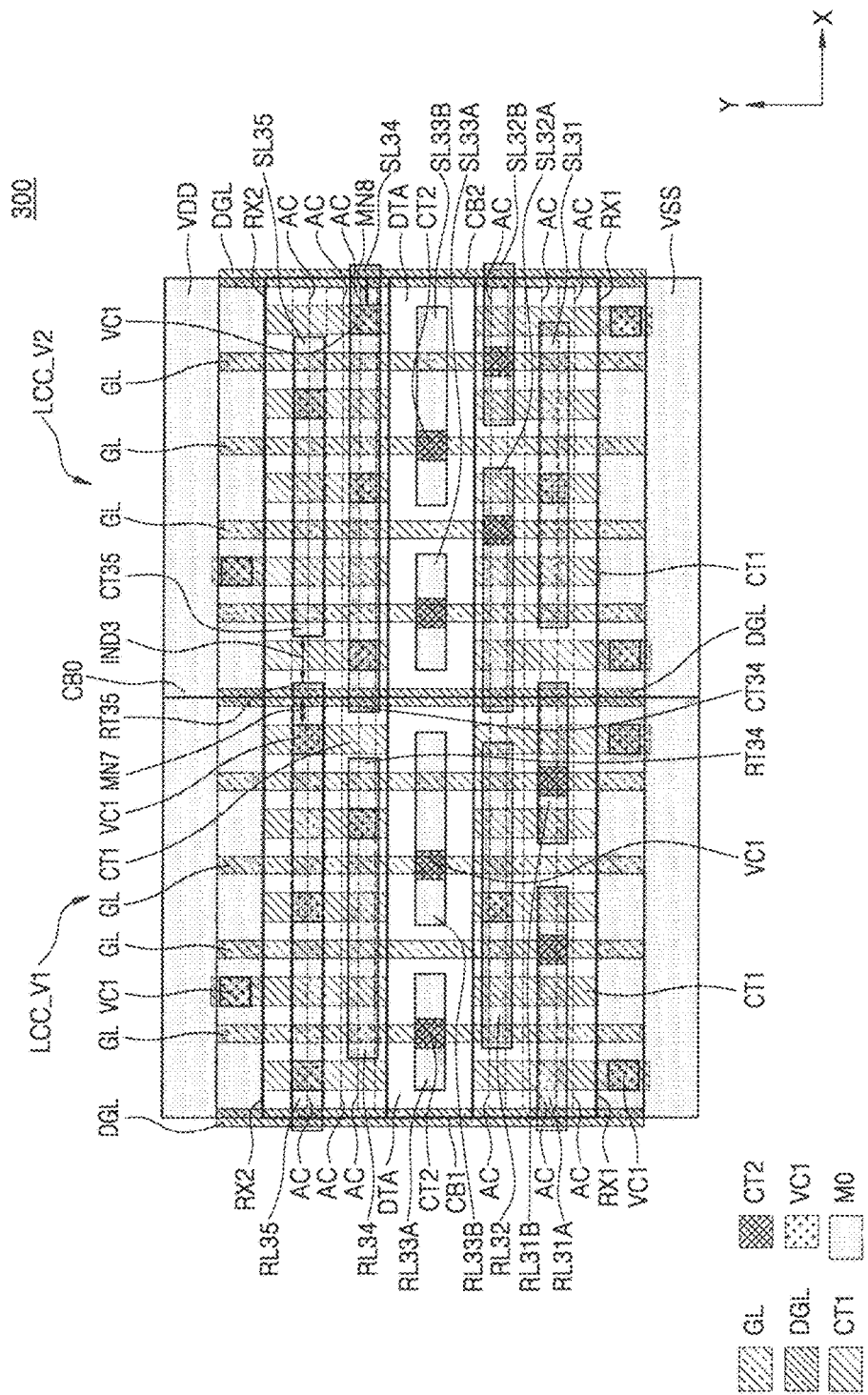
FIG. 8A is a planar layout diagram showing a main configuration of an integrated circuit device according to other embodiments of the inventive concepts.

FIG. 8A is a planar layout diagram showing a main configuration of an integrated circuit device 300 according to other embodiments of the inventive concepts. An example configuration of the integrated circuit device 300 having five M0 wiring tracks in a 7.5T logic cell will be described with reference to FIG. 8A.

Referring to FIG. 5A, the integrated circuit device 300 may include a first version logic cell LCC_V1 and a second version logic cell LCC_V2 adjacent to each other in a width direction (e.g., X direction). A first cell boundary CB1 of the first version logic cell LCC_V1 and a second cell boundary CB2 of the second version logic cell LCC_V2 may overlap each other at a cell boundary CB0. The dummy gate line DGL may extend along the cell boundary CB0. The first version logic cell LCC_V1 and the second version logic cell LCC_V2 may perform the same or similar function.

In the first version logic cell LCC_V1 and the second version logic cell LCC_V2, a plurality of fin-type active regions AC may extend in each of a first device region RX1 and a second device region RX2 in a width direction (e.g., X direction). In the first version logic cell LCC_V1 and the second version logic cell LCC_V2, an inter-device isolation region DTA may be disposed between the first device region RX1 and the second device region RX2.

In the first version logic cell LCC_V1, the M0 wiring may include first through fifth reference conductive lines RL31A, RL31B, RL32, RL33A, RL33B, RL34, and RL35 that are sequentially arranged along a height direction of the first version logic cell LCC_V1. In the second version logic cell LCC_V2, the M0 wiring may include first to fifth swap conductive lines SL31, SL32A, SL32B, SL33A, SL33B, SL34, and SL35 that are sequentially arranged along a height direction (e.g., Y direction) of the second version logic cell LCC_V2. The first swap conductive line SL31 may be arranged on a wiring track having the same height as the first reference conductive lines RL31A and RL31B. The second swap conductive lines SL32A and SL32B may be arranged on a wiring track having the same height as the second reference conductive line RL32. The third swap conductive lines SL33A and SL33B may be arranged on a wiring track having the same height as the third reference conductive lines RL33A and RL33B. The fourth swap conductive line SL34 may be arranged on a wiring track having the same height as the fourth reference conductive line RL34. The fifth swap conductive line SL35 may be disposed on a wiring track having the same height as the fifth reference conductive line RL35.

The ground line VSS and the power line VDD may extend in parallel to each other with the first to fifth reference conductive lines RL31A, RL31B, RL32, RL33A, RL33B, RL34, and RL35 and the first to fifth swap conductive lines SL31, SL32A, SL32B, SL33A, SL33B, SL34, and SL35 at the same level. Forming materials and forming methods of the first to fifth reference conductive lines RL31A, RL31B, RL32, RL33A, RL33B, RL34, and RL35 and the first to fifth swap conductive lines SL31, SL32A, SL32B, SL33A, SL33B, SL34, and SL35 are the same as described with reference to FIGS. 5A to 6E with respect to the first to fourth reference conductive lines RL11, RL12, RL13, and RL4 and the first to fourth swap conductive lines SL11, SL12, SL13, and SL14.

The first reference conductive lines RL31A and RL31B and the second swap conductive lines SL32A and SL32B may have substantially the same arrangement structure, planar shape, and/or length, but may be disposed in different wiring tracks. The second reference conductive line RL32 and the first swap conductive line SL31 may have substantially the same arrangement structure, planar shape, and/or length, but may be disposed in different wiring tracks. That is, the first reference conductive lines RL31A and RL31B and the second reference conductive line RL32 and the first swap conductive line SL31 and the second swap conductive lines SL32A and SL32B may have an arrangement structure in which wiring structures in two wiring tracks adjacent to each other are swapped.

The dummy gate line DGL extending along the cell boundary CB0 may include a portion under and/or vertically overlapping (e.g., in a direction perpendicular to the X and Y direction) with the first reference conductive line RL31B and a portion under and/or vertically overlapping (e.g., in a direction perpendicular to the X and Y direction) with the second swap conductive line SL32A.

The fourth and fifth reference conductive lines RL34 and RL35 of the first version logic cell LCC_V1 and the fourth and fifth swap conductive lines SL34 and SL35 of the second version logic cell LCC_V2 may have an arrangement structure in which wiring structures in two wiring tracks adjacent to each other are swapped. Accordingly, the fourth reference conductive line RL34 and the fifth swap conductive line SL35 may have substantially the same arrangement structure, planar shape, and/or length. In addition, the fifth reference conductive line RL35 and the fourth swap conductive line SL34 may have substantially the same arrangement structure, planar shape, and/or length.

The fifth reference conductive line RL35 may include a tip portion RT35 extending from the first version logic cell LCC_V1 into the second version logic cell LCC_V2 across the cell boundary CB0. The fifth swap conductive line SL35 may extend along a line extending from the fifth reference conductive line RL35 (e.g., extending collinearly) and may be disposed apart from the cell boundary CB0. In some embodiments, the fifth swap conductive line SL35 may include a corresponding tip portion CT35 facing the tip portion RT35 at a spaced apart position so as to secure a sufficient insulation distance IND3 from the tip portion RT35. As such, the fifth reference conductive line RL35 may include the tip portion RT35 extending into the second version logic cell LCB_V2 while ensuring the sufficient insulation distance IND3 between the fifth reference conductive line RL35 and the fifth swap conductive line SL35 adjacent thereto. In some embodiments, a sufficient contact margin between the fifth reference conductive line RL35 and the first via contact VC1 may be secured although the first via contact VC1 for connecting the fifth reference conductive line RL35 and the source/drain contact plug CT1 is formed at a relatively short distance from the cell boundary CB0.

The fourth reference conductive line RL34 may include a tip portion RT34 spaced from the cell boundary CB0 and disposed in the first cell boundary CB1 and facing the second version logic cell LCC_V2. The fourth swap conductive line SL34 may extend along a line extending from the fourth reference conductive line RL34 (e.g., extending collinearly) and may include a corresponding tip portion CT34 extending into the first version logic cell LCC_V1 across the cell boundary CB0. The corresponding tip portion CT34 of the fourth swap conductive line SL34 may face the tip portion RT34 of the fourth reference conductive line RL34.

The dummy gate line DGL extending along the cell boundary CB0 may include a portion under and/or vertically overlapping (e.g., in a direction perpendicular to the X and Y direction) with the tip portion RT35 of the fifth reference conductive line RL35 and a portion under and/or vertically overlapping (e.g., in a direction perpendicular to the X and Y direction) with the corresponding tip portion CT34 of the fourth swap conductive line SL34.

A minimum distance MN7 between the first via contact VC1 connected to the fifth reference conductive line RL35 and the first cell boundary CB1 may be equal to a minimum distance MN8 between the first via contact VC1 connected to the fourth swap conductive line SL34 and the second cell boundary CB2.

Figure 8B:
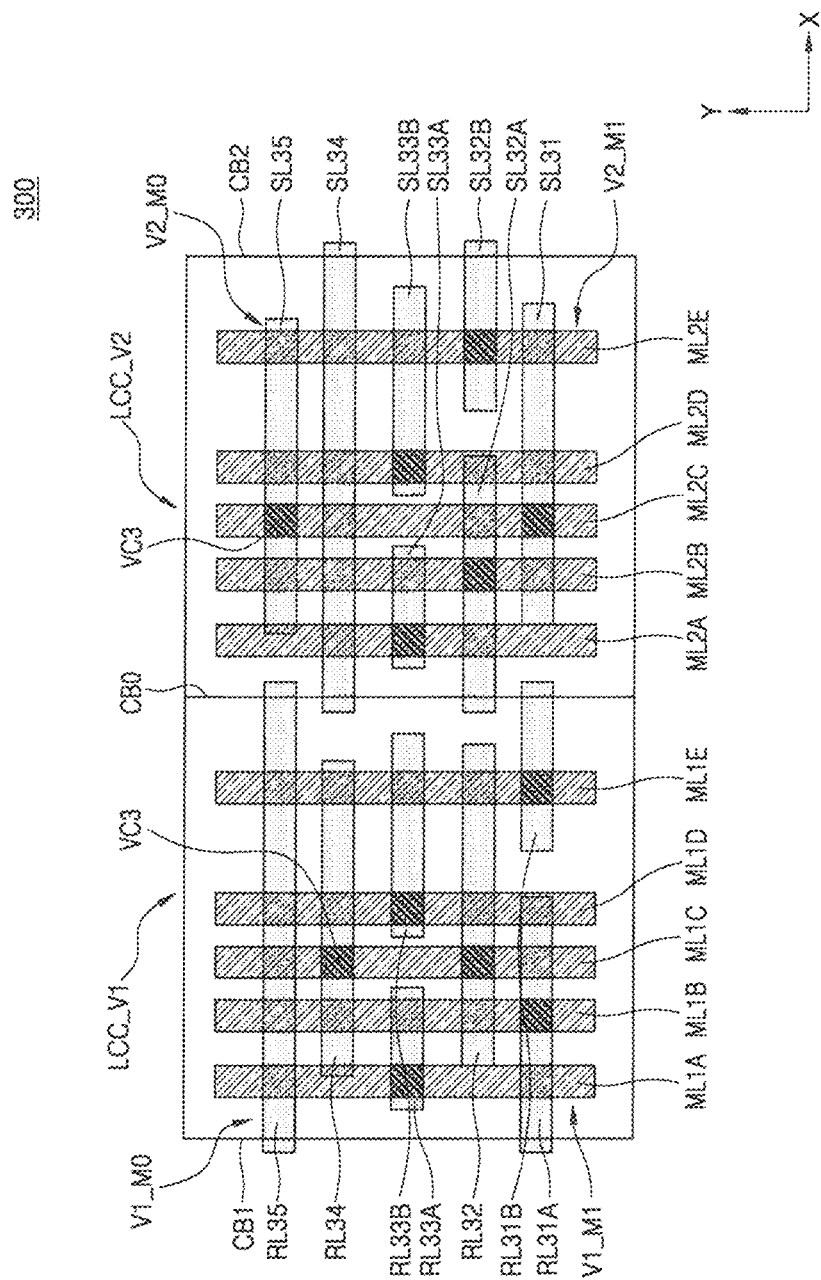
FIG. 8B is a planar layout diagram illustrating a partial configuration of multilayer wiring structures that constitute a first version logic cell and a second version logic cell of the integrated circuit device illustrated in FIG. 8A.

FIG. 8B is a planar layout diagram illustrating a partial configuration of multilayer wiring structures that constitute the first version logic cell LCC_V1 and the second version logic cell LCC_V2 of the integrated circuit device 300 illustrated in FIG. 8A.

Referring to FIG. 8B, the first version logic cell LCC_V1 may include a first version M0 wiring V1_M0 including the first through fifth reference conductive lines RL31A, RL31B, RL32, RL33A, RL33B, RL34, and RL35, and a first version M1 wiring V1_M1 connected to the first version M0 wiring V1_M0 via a plurality of third via contacts VC3 above the first version M0 wiring V1_M0. The first version M1 wiring V1_M1 may include a plurality of conductive lines ML1A, ML1B, ML1C, ML1D, and ML1E extending in a height direction (e.g., Y direction) so as to intersect with the first through fifth reference conductive lines RL31A, RL31B, RL32, RL33A, RL33B, RL34, and RL35. In some embodiments, the conductive lines may be unidirectional.

The second version logic cell LCC_V2 may include a second version M0 wiring V2_M0 including the first through fifth swap conductive lines SL31, SL32A, SL32B, SL33A, SL33B, SL34, and SL35, and a second version M1 wiring V2_M1 connected to the second version M0 wiring V2_M0 via a plurality of third via contacts VC3 above the second version M0 wiring V2_M0. The second version M1 wiring V2_M1 may include a plurality of conductive lines ML2A, ML2B, ML2C, ML2D, and ML2E extending in the height direction (e.g., Y direction) so as to intersect with the first to fifth swap conductive lines SL31, SL32A, SL32B, SL33A, SL33B, SL34, and SL35. In some embodiments, the conductive lines may be unidirectional.

The first version M1 wiring V1_M1 of the first version logic cell LCC_V1 and the second version M1 wiring V2_M1 of the second version logic cell LCC_V2 may have substantially the same arrangement structure, planar shape, and/or length.

The first version logic cell LCC_V1 and the second version logic cell LCC_V2 illustrated in FIGS. 8A and 8B may constitute a part of the cell block 12 illustrated in FIG. 1.

FIG. 9A is a planar layout diagram showing a main configuration of an integrated circuit device 400 according to other embodiments of the inventive concepts. An example configuration of the integrated circuit device 400 having six M0 wiring tracks in a 9T logic cell will be described with reference to FIG. 9A. In FIG. 9A, the same reference numerals as those in FIGS. 5A to 8B denote the same members, and detailed descriptions thereof will be omitted here.

Referring to FIG. 9A, the integrated circuit device 400 may include a plurality of first version logic cells LCD_V1 and a plurality of second version logic cells LCD_V2 alternately arranged one by one along a width direction (e.g., X direction). The dummy gate line DGL may extend in the cell boundary CB0. The plurality of first and second version logic cells LCD_V1 and LCD_V2 may perform the same or similar function.

In the plurality of first and second version logic cells LCD_V1 and LCD_V2, the wiring may include a plurality of M0 conductive lines M0 extending along six wiring tracks T1 to T6 extending in parallel to each other between the ground line VSS and the power line VDD.

The plurality of M0 conductive lines M0 arranged in the first and second wiring tracks T1 and T2 of the first version logic cell LCD_V1 and the plurality of M0 conductive lines M0 arranged in the first and second wiring tracks T1 and T2 of the second version logic cell LCD_V2 may have an arrangement structure in which wiring structures are swapped in the first and second wiring tracks T1 and T2.

The plurality of M0 conductive lines M0 arranged in the third and fourth wiring tracks T3 and T4 of the first version logic cell LCD_V1 and the plurality of M0 conductive lines M0 arranged in the third and fourth wiring tracks T3 and T4 of the second version logic cell LCD_V2 may have an arrangement structure in which wiring structures are swapped in the third and fourth wiring tracks T3 and T4.

The plurality of M0 conductive lines M0 arranged in the fifth and sixth wiring tracks T5 and T6 of the first version logic cell LCD_V1 and the plurality of M0 conductive lines M0 arranged in the fifth and sixth wiring tracks T5 and T6 of the second version logic cell LCD_V2 may have an arrangement structure in which wiring structures in the fifth and sixth wiring tracks T5 and T6 are swapped.

Some of the plurality of M0 conductive lines M0 may be arranged to extend into an adjacent different version logic cell across the cell boundary CB0. Therefore, even if the first via contact VC1 for connecting the M0 conductive line M0 and the source/drain contact plug CT1 is formed at a relatively short distance from the cell boundary CB0, a sufficient contact margin may be ensured between the M0 conductive line M0 and the first via contact VC1.

Figure 9B:
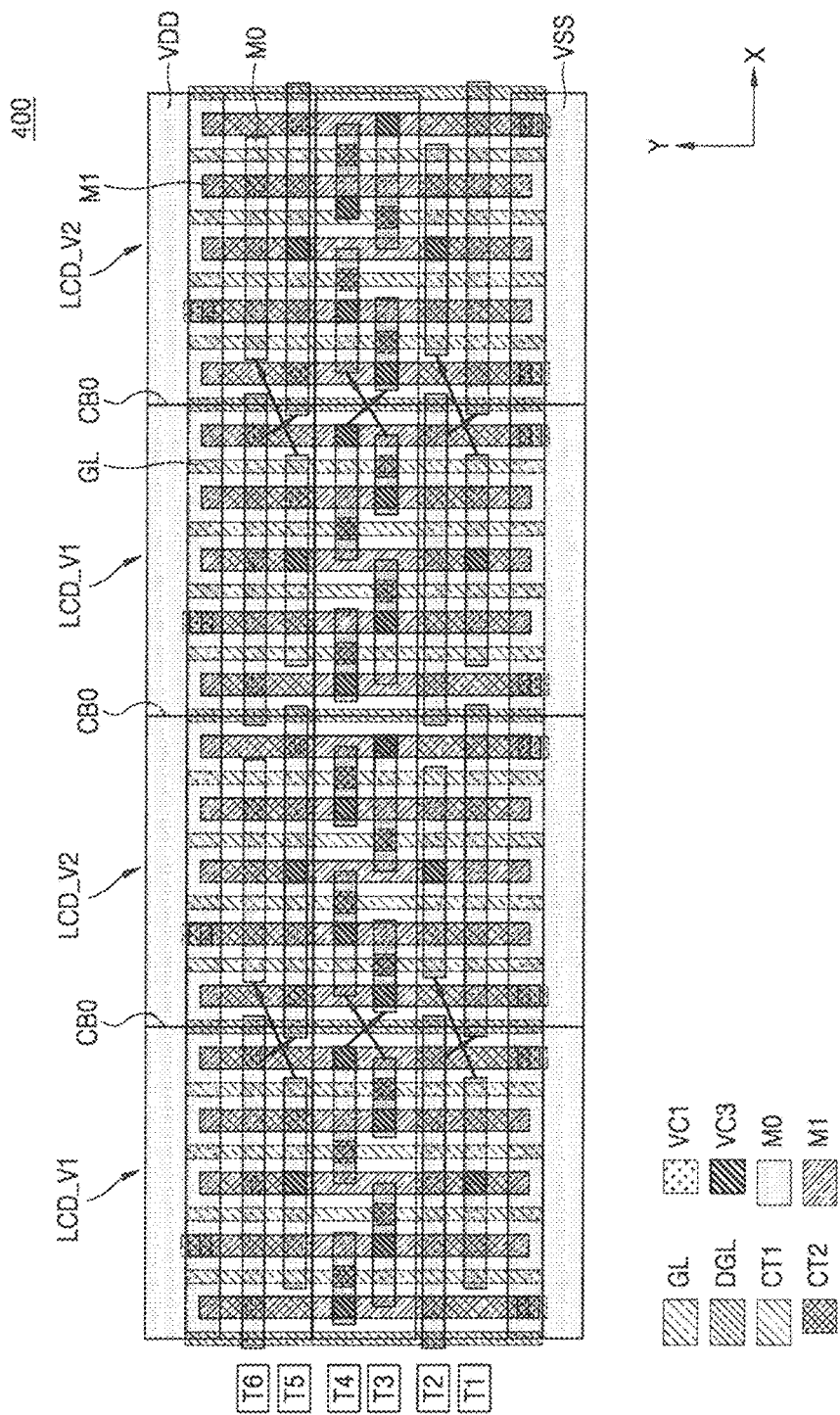

FIG. 9B also shows a plurality of M1 conductive lines M1 disposed over M0 conductive lines M0 of the first and second version logic cells LCD_V1 and LCD_V2 of the integrated circuit device 400. The plurality of M1 conductive lines M1 may include a plurality of conductive lines extending in the height direction (e.g., Y direction) so as to intersect with the plurality of M0 conductive lines M0. In some embodiments, the conductive lines may be unidirectional.

As described with reference to FIG. 9A, some of the plurality of M0 conductive lines M0 may be arranged so as to extend into other adjacent logic cells across the cell boundary CB0, and thus a contact margin of the M0 conductive lines M0 may be secured near the cell boundary CB0. Thus, the M1 conductive line M1 closest to the cell boundary CB0 among the plurality of M1 conductive lines M1 may be arranged to access the gate line GL closest to the cell boundary CB0 at a position very close to the cell boundary CB0 without departing from the cell boundary CB0.

Figure 10:
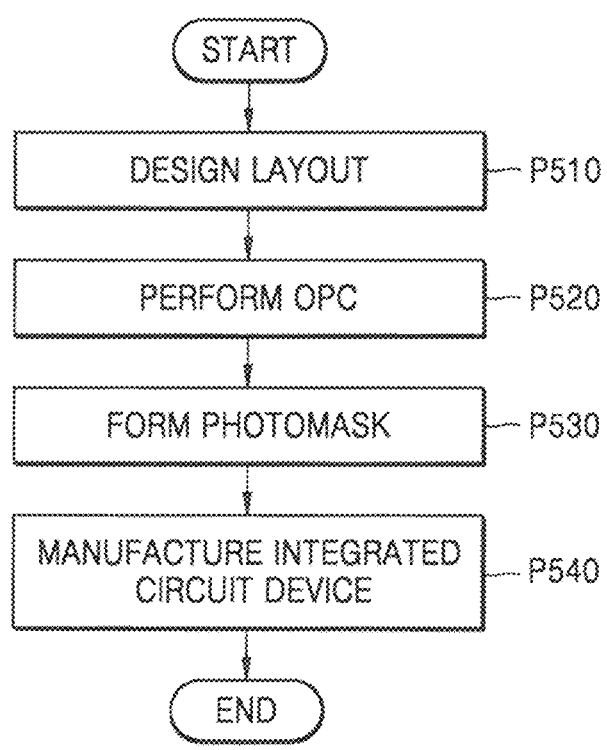
FIG. 10 is a flowchart for describing a method of manufacturing an integrated circuit device according to embodiments of the inventive concepts.

FIG. 10 is a flowchart for describing a method of manufacturing an integrated circuit device according to embodiments of the inventive concepts.

Referring to FIG. 10, in process P510, a layout of the integrated circuit device to be formed is designed.

To design the layout, a computer system having a layout design tool may be used. In some embodiments, a high-level design may be performed using a programming language such as the C language to design the layout, and a layout design may be performed based on the high-level design. The layout design may include a routing process of placing and connecting various cells provided in a cell library according to a prescribed design rule. After the routing process, it may be verified that there is a violation of the design rule in the designed layout.

Figure 11:
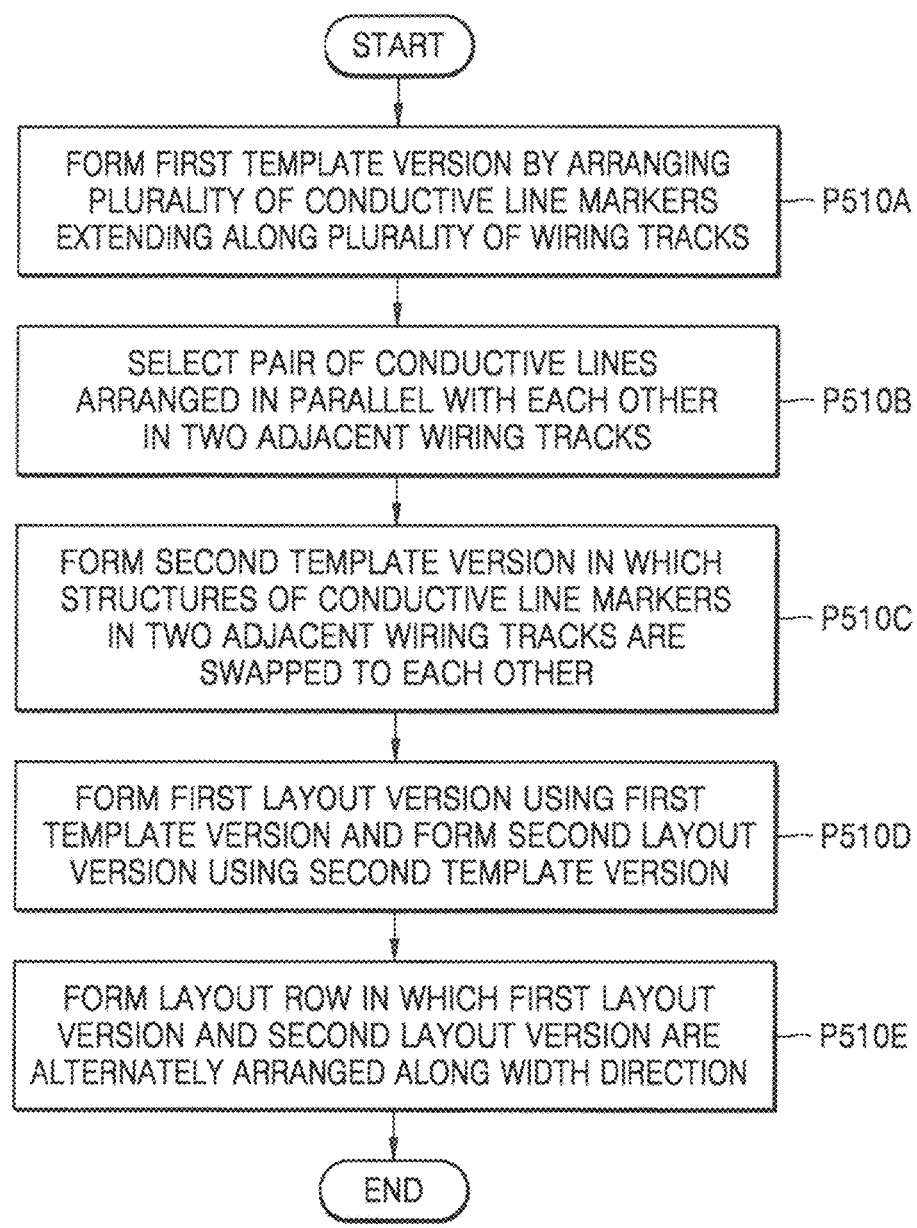
FIG. 11 is a flowchart for describing a process of designing a layout according to process P510 of FIG. 10 in more detail.

FIG. 11 is a flowchart for describing a process of designing a layout according to process P510 of FIG. 10 in more detail.

Figure 12A:
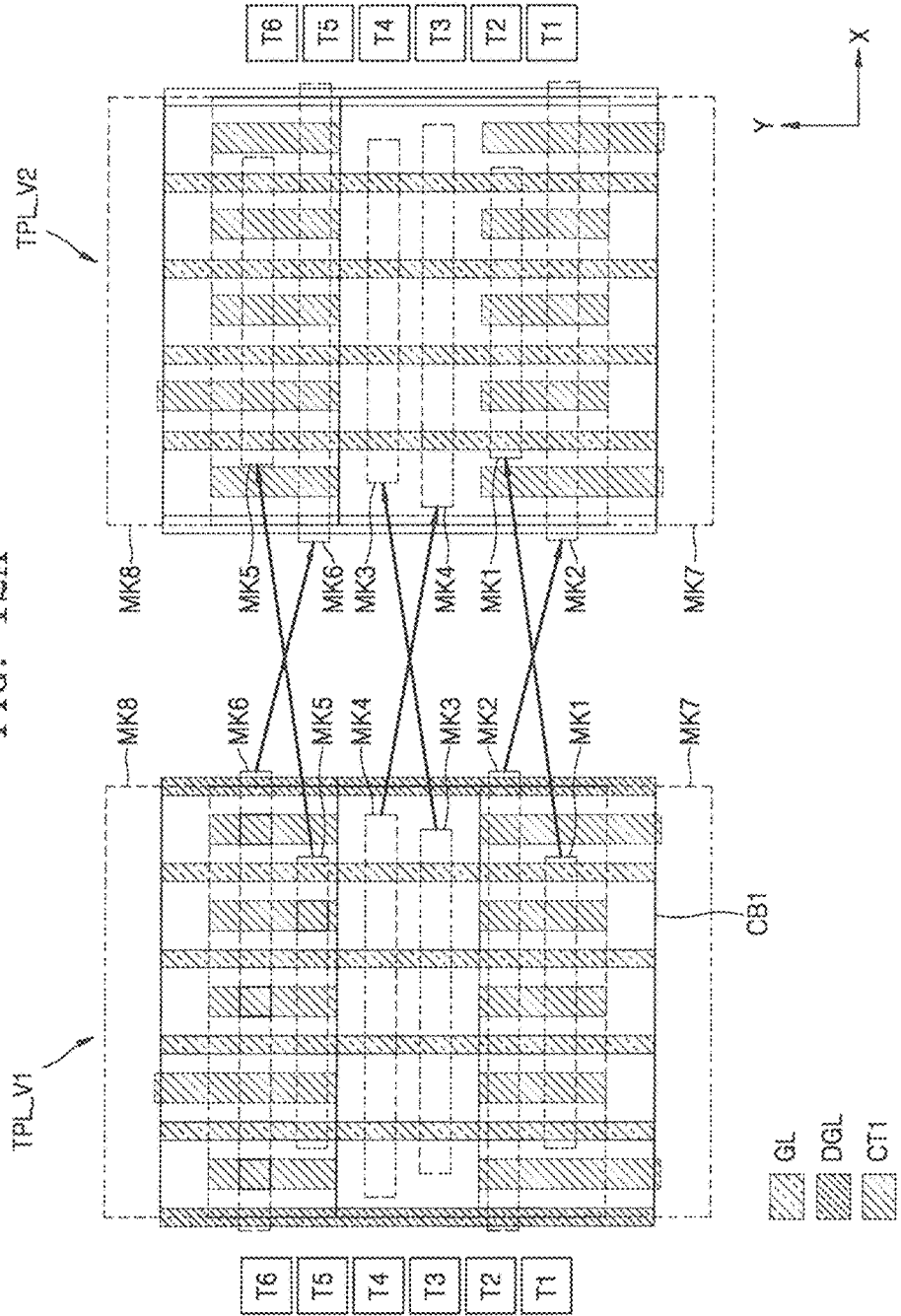

FIGS. 12A and 12B are plan views for describing a process of designing a layout according to process P510 of FIG. 10 in more detail. In this example, a layout design method for forming the integrated circuit device 400 illustrated in FIGS. 9A and 9B will be described as an example.

Referring to FIGS. 11 and 12A, in process P510A, the first cell boundary CB1 required for forming one logic cell is defined, and a plurality of conductive line markers MK1, MK2, MK3, MK4, MK5, and MK6 extending in parallel to each other in a width direction (e.g., X direction) along the plurality of wiring tracks T1 through T6 in the first cell boundary CB1 may be disposed to form a first template version TPL_V1. The first template version TPL_V1 may also include markers MK7 and MK8 for forming the ground line VSS and the power line VDD.

In process P510B, a pair of conductive lines arranged in parallel with each other in two adjacent wiring tracks may be selected from the plurality of conductive line markers MK1, MK2, MK3, MK4, MK5, and MK6 in the first template version TPL_V1.

For example, the first pair of conductive line markers MK1 and MK2, the second pair of conductive line markers MK3 and MK4, and the third pair of conductive line markers MK5 and MK6 may be selected from the plurality of conductive line markers MK1, MK2, MK3, MK4, MK5, and MK6. However, the inventive concepts are not limited thereto. In some embodiments, at least one pair of conductive line markers may be selected from the three pairs of conductive line markers. Two conductive line markers constituting each pair in the selected conductive line markers may include tip portions having different spaced distances from the first cell boundary CB1 extending along a height direction (e.g., Y direction). Like the first pair of conductive line markers MK1 and MK2 and the third pair of conductive line markers MK5 and MK6, one of a pair of conductive line markers may include a tip portion extending across the first cell boundary CB1 and departing the first template version TPL_V1 and the other one may be disposed only within the first cell boundary CB1 without departing from the first template version TPL_V1.

In process P510C, a second template version TPL_V2 may be formed in which structures of conductive line markers in two adjacent wiring tracks from the first template version TPL_V1 are swapped to each other.

In the second template version TPL_V2, the conductive line marker MK2 in the second wiring track 12 of the first template version TPL_V1 may be disposed in the first wiring track T1, and the conductive line marker MK1 in the first wiring track T1 of the first template version TPL_V1 may be disposed in the second wiring track T2. Similarly, positions of the conductive line markers MK3 and MK4 in the third and fourth wiring tracks T3 and T4 of the first template version TPL_V1 are swapped so that the conductive line markers MK4 and MK3 of the third and fourth wiring tracks T3 and T4 of the second template version TPL_V2 may be configured, and positions of the conductive line markers MK5 and MK6 in the fifth and sixth wiring tracks T5 and T6 of the first template version TPL_V1 are swapped so that the conductive line markers MK6 and MK5 of the fifth and sixth wiring tracks T5 and T6 of the second template version TPL_V2 may be configured.

Referring to FIGS. 11 and 12B, in process P510D, a first layout version LO_V1 may be formed using the first template version TPL_V1, and a second layout version LO_V2 may be formed using the second template version TPL_V2.

The plurality of M0 conductive lines M0 of the first version logic cell LCD_V1 illustrated in FIGS. 9A and 9B may be formed using the first layout version LO_V1. The plurality of M0 conductive lines M0 of the second version logic cell LCD_V2 illustrated in FIGS. 9A and 9B may be formed using the second layout version LO_V2.

In process P510E of FIG. 11, a layout row in which the first layout version LO_V1 and the second layout version LO_V2 are alternately arranged along the width direction (e.g., X direction) may be formed.

FIG. 9A illustrates the M0 wiring of the integrated circuit device 400 obtained from the layout row in which the two first layout versions LO_V and the two second layout versions LO_V2 are alternately arranged. According to the inventive concepts, the number of each of the first layout versions LO_V1 and the second layout versions LO_V2 included in one layout row may not be particularly limited to the configuration of FIGS. 9A and 9B and may be selected as needed. Although the two first version logic cell LCD_V1 and the second version logic cell LCD_V2 adjacent to each other perform the same or similar function in the integrated circuit device 400 illustrated in FIG. 9A, the inventive concepts are not limited thereto. That is, a pair of adjacent logic cells in which configurations of conductive lines in a pair of wiring tracks are swapped with each other may perform different functions.

Referring again to FIG. 10, in process P520, optical proximity correction (OPC) may be performed on the layout obtained in process P510 to correct a distortion phenomenon that may occur in a photolithography process.

In process P530, a photomask may be formed based on the layout that has been subjected to an OPC process according to process P520.

In process P540, an integrated circuit device may be manufactured by performing an exposure process using the photomask formed according to process P530, a subsequent etching process, and the like.

The exposure process may be performed using extreme ultraviolet (EUV) (13.5 nm), F2 excimer laser (157 nm), ArF excimer laser (193 nm), or KrF excimer laser (248 nm).

In some embodiments, a single patterning process may be used to implement the M0 wiring structure described with reference to FIGS. 5A through 9B. In some embodiments, to implement the M0 wiring structure described with reference to FIGS. 5A through 9B, a self-aligned double, triple, or quadruple patterning technique may be used to form a plurality of conductive lines extending in parallel to each other at an M0 wiring level, and then a cutting process may be performed to remove unnecessary portions such that a final structure remains according to a desired layout.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the inventive concepts have been particularly shown and described with reference to embodiments thereof, it will be understood that various changes in form and details may be made therein without departing from the spirit and scope of the following claims.

What is claimed is:

1. An integrated circuit device comprising:
  a plurality of reference conductive lines extending in a first direction within a first logic cell region defined by a first cell boundary, the plurality of reference conductive lines extending along a plurality of wiring tracks arranged in parallel with each other; and
  a plurality of swap conductive lines extending along the plurality of wiring tracks in a second logic cell region defined by a second cell boundary,
  wherein at least one reference conductive line of the plurality of reference conductive lines comprises a first tip portion extending from the first logic cell region into the second logic cell region across the first cell boundary,
  wherein at least one swap conductive line of the plurality of swap conductive lines comprises a first corresponding tip portion extending from the second logic cell region into the first logic cell region across the second cell boundary, and wherein the first tip portion and the first corresponding tip portion are spaced apart from one another in a second direction perpendicular to the first direction.

2. The integrated circuit device according to claim 1, wherein a planar shape of the at least one reference conductive line is the same as a planar shape of the at least one swap conductive line.

3. The integrated circuit device according to claim 1, wherein, in the first direction, a length of the at least one reference conductive line is the same as a length of the at least one swap conductive line.

4. The integrated circuit device according to claim 1, further comprising: a cell boundary portion in which the first cell boundary and the second cell boundary overlap with each other, and a dummy gate line extending along the cell boundary portion,
  wherein the dummy gate line comprises a first portion vertically overlapping the at least one reference conductive line under the at least one reference conductive line and a second portion vertically overlapping at least one swap conductive line under the at least one swap conductive line.

5. The integrated circuit device according to claim 1, wherein the plurality of reference conductive lines and the plurality of swap conductive lines are wiring layers extending in the first direction.

6. An integrated circuit device comprising:
  a first logic cell region comprising a first reference conductive line and a second reference conductive line extending in parallel to each other in a first direction on a substrate;
  a second logic cell region comprising a first swap conductive line and a second swap conductive line extending in parallel to each other in the first direction on the substrate; and
  a cell boundary portion between the first logic cell region and the second logic cell region,
  wherein the first reference conductive line comprises a first tip portion spaced from the cell boundary portion within the first logic cell region and facing the second logic cell region,
  wherein the second reference conductive line comprises a second tip portion extending from the first logic cell region into the second logic cell region across the cell boundary portion,
  wherein the first swap conductive line comprises a first corresponding tip portion extending collinear to the first reference conductive line and extending into the first logic cell region across the cell boundary portion to face the first tip portion, and
  wherein the second swap conductive line comprises a second corresponding tip portion extending collinear to the second reference conductive line and spaced from the cell boundary portion within the second logic cell region to face the second tip portion.

7. The integrated circuit device according to claim 6, wherein the first logic cell region comprises a plurality of first conductive lines extending along a plurality of first wiring tracks extending in parallel to each other in the first direction, and
  wherein the first reference conductive line and the second reference conductive line are two adjacent first conductive lines among the plurality of first conductive lines.

8. The integrated circuit device according to claim 6,
  wherein the first reference conductive line and the second swap conductive line have the same length in the first direction, and
  wherein the second reference conductive line and the first swap conductive line have the same length in the first direction.

9. The integrated circuit device according to claim 6, further comprising:
  a plurality of first gate lines extending in a second direction intersecting the first direction within the first logic cell region;
  a plurality of second gate lines extending in the second direction within the second logic cell region; and
  a dummy gate line extending in the second direction along the cell boundary portion,
  wherein the plurality of first gate lines, the dummy gate line, and the plurality of second gate lines have the same width in the first direction and are arranged at a constant pitch in the first direction.

10. The integrated circuit device according to claim 9, wherein the dummy gate line covers a portion of the first logic cell region and a portion of the second logic cell region.

11. The integrated circuit device according to claim 6, further comprising:
  a first gate line extending in a second direction crossing the first direction on a first active region of the first logic cell region;
  a first source/drain region on the first active region at one side of the first gate line;
  a first source/drain contact plug connected between the second reference conductive line and the first source/drain region;
  a second gate line extending in the second direction on a second active region of the second logic cell region;
  a second source/drain region on the second active region at one side of the second gate line; and
  a second source/drain contact plug connected between the first swap conductive line and the second source/drain region,
  wherein a first minimum distance from a first cell boundary of the first logic cell region to the first source/drain contact plug in the first direction is the same as a second minimum distance from a second cell boundary of the second logic cell region to the second source/drain contact plug.

12. The integrated circuit device according to claim 11, wherein a length of the first source/drain contact plug in the second direction is greater than a length of the second source/drain contact plug.

13. The integrated circuit device according to claim 6, further comprising:
  a first gate line extending in a second direction crossing the first direction in the first logic cell region;
  a second gate line extending in the second direction in the second logic cell region;
  a first gate contact plug connected between the first reference conductive line and the first gate line; and
  a second gate contact plug connected between the second swap conductive line and the second gate line,
  wherein a first minimum distance from a first cell boundary of the first logic cell region to the first gate contact plug in the first direction is the same as a second minimum distance from a second cell boundary of the second logic cell region to the second gate contact plug.

14. The integrated circuit device according to claim 6, wherein the first logic cell region and the second logic cell region are configured to perform the same function.

15. The integrated circuit device according to claim 6, wherein the first logic cell region and the second logic cell region are configured to perform different functions.

16. An integrated circuit device comprising:
- a first version logic cell comprising a plurality of first gate lines on a substrate and a first multilayer wiring structure on the plurality of first gate lines and configured to perform a first function;
- a second version logic cell adjacent the first version logic cell on the substrate, the second version logic cell comprising a plurality of second gate lines and a second multilayer wiring structure on the plurality of second gate lines and configured to perform the first function;
- a pair of reference conductive lines arranged in parallel with each other in a first direction at a first level closest to the plurality of first gate lines in the first multilayer wiring structure; and
- a pair of swap conductive lines arranged in parallel with each other in the first direction at a same level as the first level in the second multilayer wiring structure,
- wherein one reference conductive line and one swap conductive line in different wiring tracks among the pair of reference conductive lines and the pair of swap conductive lines have a same planar shape and a same length, and
- wherein the one reference conductive line and the one swap conductive line extend so as to intersect a cell boundary between the first version logic cell and the second version logic cell, respectively.

17. The integrated circuit device according to claim 16, further comprising: a dummy gate line extending along the cell boundary,
- wherein the dummy gate line, the plurality of first gate lines, and the plurality of second gate lines extend in parallel to each other and are arranged at a constant pitch in the first direction.

18. The integrated circuit device according to claim 17, wherein the dummy gate line, the plurality of first gate lines, and the plurality of second gate lines extend in a direction crossing the first direction.

19. The integrated circuit device according to claim 16,
- wherein the pair of reference conductive lines comprises a first reference conductive line that does not intersect the cell boundary and a second reference conductive line that extends across the cell boundary,
- wherein the pair of swap conductive lines comprises a first swap conductive line that extends across the cell boundary and a second swap conductive line that does not intersect the cell boundary, and
- wherein the first reference conductive line and the first swap conductive line extend collinearly along a first wiring track selected from a plurality of mutually parallel wiring tracks and the second reference conductive line and the second swap conductive line extend collinearly along a second wiring track adjacent to the first wiring track among the plurality of wiring tracks.

20. The integrated circuit device according to claim 19,
- wherein the second reference conductive line is in contact with a first source/drain contact plug connected to a first source/drain region of the first version logic cell,
- wherein the first swap conductive line is in contact with a second source/drain contact plug connected to a second source/drain region of the second version logic cell, and
- wherein a length of the first source/drain contact plug is greater than a length of the second source/drain contact plug in a second direction crossing the first direction.

* * * * *